US011139918B2

(12) United States Patent
Zhou et al.

(10) Patent No.: US 11,139,918 B2
(45) Date of Patent: Oct. 5, 2021

(54) INTERLEAVING METHOD AND INTERLEAVING APPARATUS

(71) Applicant: HUAWEI TECHNOLOGIES CO., LTD., Shenzhen (CN)

(72) Inventors: Yue Zhou, Hangzhou (CN); Guijie Wang, Hangzhou (CN); Rong Li, Hangzhou (CN); Yinggang Du, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 10 days.

(21) Appl. No.: 16/812,353

(22) Filed: Mar. 8, 2020

(65) Prior Publication Data
US 2020/0213038 A1 Jul. 2, 2020

Related U.S. Application Data

(63) Continuation of application No. PCT/CN2018/104653, filed on Sep. 7, 2018.

(30) Foreign Application Priority Data

Sep. 8, 2017 (CN) .......................... 201710806792.5

(51) Int. Cl.
*H04L 1/00* (2006.01)
*H03M 13/13* (2006.01)
(Continued)

(52) U.S. Cl.
CPC .......... *H04L 1/0071* (2013.01); *H03M 13/13* (2013.01); *H03M 13/2792* (2013.01); *H03M 13/616* (2013.01); *H04L 1/0057* (2013.01)

(58) Field of Classification Search
CPC .... H04L 1/0071; H04L 1/0057; H03M 13/13; H03M 13/2792; H03M 13/616
See application file for complete search history.

(56) References Cited

U.S. PATENT DOCUMENTS 5,907,560 A * 5/1999 Spruyt ................. H04L 1/0041
714/701
6,771,670 B1 * 8/2004 Pfahler ................. H04B 7/2678
370/342
(Continued)

FOREIGN PATENT DOCUMENTS

CN 102299727 A 12/2011
CN 102377516 A 3/2012
(Continued)

OTHER PUBLICATIONS

Qualcomm Incorporated: "Design and evaluation ofinterleaver for Polar codes",3GPP DRAFT; R1-1715248,Aug. 26, 2017 (Aug. 26, 2017), XP051328723,total 14 pages.
(Continued)

*Primary Examiner* — Kyle Vallecillo
(74) *Attorney, Agent, or Firm* — Hauptman Ham, LLP

(57) ABSTRACT

Various embodiments provide an interleaving method, to improve error correction performance of a polar code. In these embodiments, a first bit sequence is obtained. The first bit sequence includes L number of bits, and L is a positive integer. The L number of bits are then written into an interleaving matrix according to a preset write rule. The interleaving matrix includes C rows and R number of columns. C and R are positive integers. The L number of bits can be read from the interleaving matrix according to a preset read rule to obtain a second bit sequence. The second bit sequence includes L number of bits; and sending the second bit sequence.

20 Claims, 16 Drawing Sheets

(51) Int. Cl.
*H03M 13/27* (2006.01)
*H03M 13/00* (2006.01)

(56) References Cited

U.S. PATENT DOCUMENTS

| | | | |
|---|---|---|---|
| 6,781,976 B1* | 8/2004 | Sonning | H04J 3/0632 370/335 |
| 7,127,004 B1* | 10/2006 | Sonning | H03M 13/2707 375/295 |
| 2003/0091098 A1 | 5/2003 | Manninen et al. | |
| 2003/0149849 A1* | 8/2003 | Kim | H03M 13/276 711/157 |
| 2006/0104379 A1* | 5/2006 | Li | H04L 1/0068 375/267 |
| 2007/0250752 A1* | 10/2007 | Prosch | H03M 13/2707 714/752 |
| 2008/0232489 A1* | 9/2008 | Tsai | H04L 1/0071 375/260 |
| 2011/0243066 A1* | 10/2011 | Nayeb Nazar | H04L 1/1671 370/328 |
| 2011/0249578 A1* | 10/2011 | Nayeb Nazar | H04W 72/10 370/252 |
| 2013/0188623 A1* | 7/2013 | Chen | H04L 1/0072 370/336 |
| 2014/0056330 A1* | 2/2014 | Petrov | H04L 27/20 375/135 |
| 2014/0126674 A1* | 5/2014 | Petrov | H03M 13/2792 375/340 |
| 2014/0129895 A1* | 5/2014 | Petrov | H03M 13/27 714/752 |
| 2015/0121176 A1 | 4/2015 | Myung et al. | |
| 2015/0188734 A1* | 7/2015 | Petrov | H03M 13/255 375/260 |
| 2015/0200747 A1 | 7/2015 | Petrov | |
| 2017/0126378 A1* | 5/2017 | Luo | H04L 1/0007 |
| 2018/0083736 A1* | 3/2018 | Manolakos | H03M 13/2789 |
| 2020/0228289 A1* | 7/2020 | He | H04L 5/0064 |
| 2020/0403640 A1* | 12/2020 | Jeon | H03M 13/2792 |

FOREIGN PATENT DOCUMENTS

| | | |
|---|---|---|
| CN | 106230489 A | 12/2016 |
| CN | 107005996 B | 7/2019 |

OTHER PUBLICATIONS

Zte: "Consideration on high order modulation and interleaver forPolar Codes",3GPP DRAFT; R1-1713236,Aug. 17, 2017 (Aug. 17, 2017), XP051328049,total 8 pages.

Mediatek Inc: "Polar channel bit interleaving design andperformance",3GPP DRAFT; R1-1713706,Aug. 17, 2017 (Aug. 17, 2017), XP051328067,total 8 pages.

Ericsson: "Channel Interleaver for Polar Codes",3GPP DRAFT; R1-1714691,Aug. 26, 2017 (Aug. 26, 2017), XP051328242,total 28 pages.

* cited by examiner

INTERLEAVING METHOD AND INTERLEAVING APPARATUS

CROSS-REFERENCE TO RELATED APPLICATIONS

This application is a continuation of International Application No. PCT/CN2018/104653, filed on Sep. 7, 2018, which claims priority to Chinese Patent Application No. 201710806792.5, filed on Sep. 8, 2017. The disclosures of the aforementioned applications are hereby incorporated by reference in their entireties.

TECHNICAL FIELD

This application relates to the field of channel coding, and in particular, to an interleaving method and an interleaving apparatus.

BACKGROUND

In a communications system, channel coding is usually performed to improve data transmission reliability, so as to ensure communication quality. On a fading channel, bit errors often occur in strings (that is, burst errors), and channel coding is effective only in detecting and correcting a single error or a short string of errors (that is, random errors). Therefore, an interleaving technology is proposed in the prior art. A function of interleaving is to disrupt an original data sequence, so that correlation between data sequences before and after the interleaving is reduced. In this way, a probability of a burst error of data can be reduced. Even if an error occurs, the error is a single error or a very short string of errors. In this way, the error can be corrected by using an error correction capability of channel coding, to recover the original data sequence. According to different interleaving modes, interleaving mainly includes row-column interleaving and random interleaving.

A polar code (that is, a polar code) is the first good code that is theoretically proved to be capable of achieving a Shannon capacity and that has low coding and decoding complexity, and therefore, is widely applied. When the polar code is used to perform channel coding, if a random interleaving mode is used, when an interleaved sequence is calculated offline, a permutation sequence needs to be stored for interleaving and deinterleaving. When a code length is relatively long, a quantity of storage resources required for random interleaving is very large or even unacceptable. However, if a row-column interleaving mode is used, error correction performance is relatively poor in higher order modulation.

SUMMARY

Various embodiments provide an interleaving method and an interleaving apparatus, to improve error correction performance of a polar code in higher order modulation.

According to a first aspect, an interleaving method is provided. The method includes: obtaining a first bit sequence, where the first bit sequence includes L number of bits, and L is a positive integer; writing the L number of bits into an interleaving matrix according to a preset write rule, where the interleaving matrix includes C rows and R number of columns, and C and R are positive integers; reading the L number of bits from the interleaving matrix according to a preset read rule, to obtain a second bit sequence, where the second bit sequence includes L number of bits; and sending the second bit sequence.

It should be understood that the first bit sequence is a to-be-interleaved bit sequence. The second bit sequence is an interleaved sequence. A process of writing the L number of bits included in the first bit sequence into the interleaving matrix according to the write rule, and reading the L number of bits according to the read rule to obtain the second bit sequence is actually an interleaving process.

The to-be-interleaved bit sequence is written into the interleaving matrix according to the write rule in this embodiment, so that bits written into at least one row and at least one column of the interleaving matrix are discontinuous in the first bit sequence; or bits written into at least one row of the interleaving matrix are discontinuous in the first bit sequence, and quantities of bits written into at least two columns are not equal; or bits written into at least one row of the interleaving matrix are discontinuous in the first bit sequence, and bits written into at least one column are discontinuous in the first bit sequence.

It may be understood that the L number of bits in the first bit sequence are written into the interleaving matrix, so that the interleaving matrix satisfies the foregoing described features. This is an external expression form of the interleaving method proposed in this application. In this embodiment, the interleaving method designed based on row-column interleaving can improve, by using quasi periodicity of a polar code, error correction performance of the polar code used for channel coding.

With reference to the first aspect, in some implementations of the first aspect, the writing the L number of bits into an interleaving matrix according to the write rule includes: writing the L number of bits into at least one interleaving unit of the interleaving matrix column by column, where each column includes B number of bits, each interleaving unit includes B number of rows and R number of columns, and B is a positive integer.

With reference to the first aspect, in some implementations of the first aspect, the writing the L number of bits into an interleaving matrix according to the write rule includes: writing the L number of bits into an $i^{th}$ interleaving unit of the interleaving matrix column by column, where each column includes Bi number of bits, the $i^{th}$ interleaving unit includes $B_i$ rows and R number of columns, $i \geq 2$ and is an integer, $B_i$ is a positive integer, the interleaving matrix includes at least two interleaving units, each interleaving unit includes R number of columns, and any two of the at least two interleaving units include different quantities of rows.

With reference to the first aspect, in some implementations of the first aspect, the writing the L number of bits into an interleaving matrix according to the write rule includes: writing the L number of bits into the R number of columns of the interleaving matrix column by column, where a quantity $B_j$ of bits written into each of the R number of columns is different, quantities of bits written into the first column to an $R^{th}$ column in the R number of columns progressively increase or decrease as the column index j increases, j traverses values in $\{1, 2, \ldots, R\}$, and $B_j$ is a positive integer.

With reference to the first aspect, in some implementations of the first aspect, $B_j$ is an exponential power of 2, or $B_j$ is an odd number or a prime number.

With reference to the first aspect, in some implementations of the first aspect, the writing the L number of bits into an interleaving matrix according to the write rule includes:

writing the L number of bits into the R number of columns of the interleaving matrix column by column in n rounds, where writing is performed into at least one of the R number of columns in each round, a quantity $B_k$ of bits written into the at least one column in each round progressively increases as the column index k increases, n 2 and is an integer, 1≤k≤R, and k and $B_k$ are positive integers.

With reference to the first aspect, in some implementations of the first aspect, when the L number of bits are written into the interleaving matrix according to the write rule, write directions in any two rounds of writing may be the same or may be different.

With reference to the first aspect, in some implementations of the first aspect, before the reading the L number of bits from the interleaving matrix according to the read rule, the method further includes: performing column transformation on the interleaving matrix, where a manner of the column transformation includes: odd-even exchange, bit reversal, or column transformation performed based on a predefined transform function.

With reference to the first aspect, in some implementations of the first aspect, the read rule includes at least one of the following: performing reading from left to right; performing reading from right to left; and performing reading from left to right in an odd row, and performing reading from right to left in an even row, where all the rows of the interleaving matrix have a same read direction, each row has a different read start point, and the read start point of each row is determined based on a predefined read function.

According to a second aspect, this application provides an interleaving apparatus. The apparatus is configured to perform the method in the first aspect or any possible implementation of the first aspect. Specifically, the apparatus includes units configured to perform the method in the first aspect or any possible implementation of the first aspect.

The interleaving apparatus provided in this application performs bit interleaving by using quasi periodicity of a polar code, to improve error correction performance of the polar code used for channel coding.

According to a third aspect, this application provides an interleaving device. The interleaving device includes one or more processors, one or more memories, and one or more transceivers (each transceiver includes a transmitter and a receiver). The transmitter or the receiver sends or receives a signal by using an antenna. The memory is configured to store a computer program instruction (in other words, code). The processor is configured to execute the instruction stored in the memory. When the instruction is executed, the processor performs the method in the first aspect or any possible implementation of the first aspect.

According to a fourth aspect, this application provides a computer-readable storage medium. The computer-readable storage medium stores an instruction. When the instruction is run on a computer, the computer is enabled to perform the method in the first aspect or any possible implementation of the first aspect.

According to a fifth aspect, this application provides a chip (or a chip system). The chip includes a memory and a processor. The memory is configured to store a computer program, and the processor is configured to invoke the computer program from the memory and run the computer program, so that a communications device on which the chip is installed performs the method in the first aspect or any possible implementation of the first aspect.

According to a sixth aspect, this application provides a computer program product. The computer program product includes computer program code. When the computer program code is run on a computer, the computer is enabled to perform the method in the first aspect or any possible implementation of the first aspect.

According to a seventh aspect, this application provides a coding apparatus. The coding apparatus has functions of implementing the method in the first aspect or any possible implementation of the first aspect. The functions may be implemented by hardware, or may be implemented by hardware executing corresponding software. The hardware or the software includes one or more modules corresponding to the foregoing functions.

In a possible design, when some or all of the functions are implemented by hardware, the coding apparatus includes: an input interface circuit, configured to obtain a first bit sequence; a logic circuit, configured to perform the interleaving method in the first aspect or any possible design of the first aspect; and an output interface circuit, configured to output a second bit sequence.

In some embodiments, the coding apparatus may be a chip or an integrated circuit.

In a possible design, when some or all of the functions are implemented by software, the coding apparatus includes: a memory, configured to store a program; and a processor, configured to execute the program stored in the memory. When the program is executed, the coding apparatus may implement the interleaving method in the first aspect or any possible design of the first aspect.

In a possible design, when some or all of the functions are implemented by software, the coding apparatus includes a processor. A memory configured to store a program is located outside the coding apparatus. The processor is connected to the memory through a circuit/an electric wire, and is configured to read and execute the program stored in the memory.

According to an eighth aspect, this application provides a deinterleaving method. The method includes: obtaining a to-be-deinterleaved bit sequence; and deinterleaving the to-be-deinterleaved bit sequence according to a preset write rule and read rule, to obtain a deinterleaved bit sequence.

In an ideal noiseless case, the deinterleaved bit sequence is the same as a first bit sequence.

It should be noted that deinterleaving is an inverse process of interleaving. When obtaining the to-be-deinterleaved bit sequence, a decoder performs an inverse operation of an interleaving operation performed by an encoder according to a write rule and a read rule, to deinterleave the to-be-deinterleaved bit sequence. Based on the interleaving method described in the first aspect, a person skilled in the art easily obtains the deinterleaving method. Therefore, details are not described in this specification.

It should be understood that the interleaving method in the first aspect or any possible implementation of the first aspect has a corresponding deinterleaving method. Details are not described one by one herein.

According to a ninth aspect, this application provides a deinterleaving apparatus. The apparatus is configured to perform the deinterleaving method in the eighth aspect or any possible implementation of the eighth aspect. Specifically, the apparatus includes units configured to perform the method in the eighth aspect or any possible implementation of the eighth aspect.

According to a tenth aspect, this application provides a deinterleaving device. The deinterleaving device includes one or more processors, one or more memories, and one or more transceivers (each transceiver includes a transmitter and a receiver). The transmitter or the receiver sends or receives a signal by using an antenna. The memory is configured to store a computer program instruction (in other words, code). The processor is configured to execute the instruction stored in the memory. When the instruction is executed, the processor performs the method in the eighth aspect or any possible implementation of the eighth aspect.

According to an eleventh aspect, this application provides a computer-readable storage medium. The computer-readable storage medium stores an instruction. When the instruction is run on a computer, the computer is enabled to perform the method in the eighth aspect or any possible implementation of the eighth aspect.

According to a twelfth aspect, this application provides a chip (or a chip system). The chip includes a memory and a processor. The memory is configured to store a computer program, and the processor is configured to invoke the computer program from the memory and run the computer program, so that a communications device on which the chip is installed performs the method in the eighth aspect or any possible implementation of the eighth aspect.

According to a thirteenth aspect, this application provides a computer program product. The computer program product includes computer program code. When the computer program code is run on a computer, the computer is enabled to perform the method in the eighth aspect or any possible implementation of the eighth aspect.

According to a fourteenth aspect, this application provides a decoding apparatus. The decoding apparatus has functions of implementing the method in the eighth aspect or any possible implementation of the eighth aspect. The functions may be implemented by hardware, or may be implemented by hardware executing corresponding software. The hardware or the software includes one or more modules corresponding to the foregoing functions.

In a possible design, when some or all of the functions are implemented by hardware, the decoding apparatus includes: an input interface circuit, configured to obtain a to-be-deinterleaved bit sequence; a logic circuit, configured to perform the deinterleaving method in the eighth aspect or any possible design of the eighth aspect; and an output interface circuit, configured to output a deinterleaved bit sequence.

In some embodiments, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus may implement the deinterleaving method in the eighth aspect or any possible design of the eighth aspect.

In a possible design, when some or all of the functions are implemented by software, the decoding apparatus includes a processor. A memory configured to store a program is located outside the decoding apparatus. The processor is connected to the memory through a circuit/an electric wire, and is configured to read and execute the program stored in the memory.

In some embodiments, the memory may be a physically independent unit, or may be integrated with the processor.

In the embodiments of this application, by using the quasi periodicity of the polar code, the error correction performance of the interleaving method designed based on row-column interleaving is similar to or even higher than that of random interleaving, and the error correction performance of the polar code used for channel coding can be improved.

DESCRIPTION OF EMBODIMENTS

The following describes the technical solutions in this application with reference to the accompanying drawings.

Figure 1:
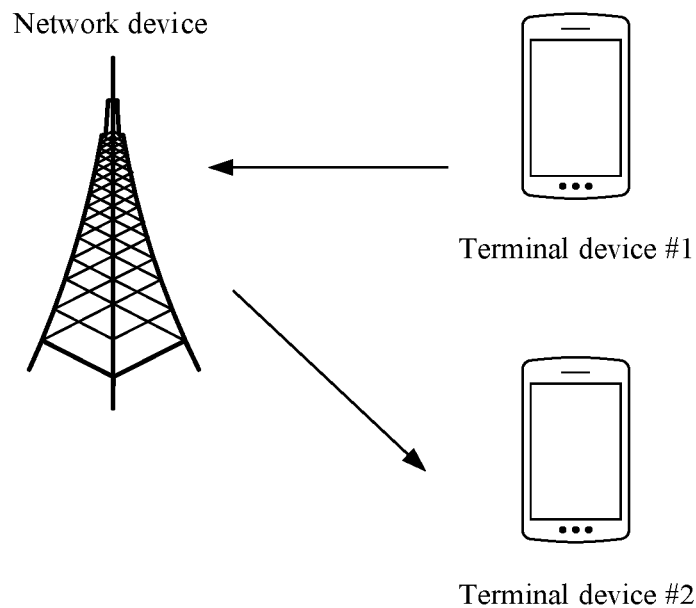
FIG. 1 shows a wireless communications system applicable to an embodiment of this application.

FIG. 1 shows a wireless communications system 100 applicable to an embodiment of this application. The wireless communications system may include at least one network device. The network device communicates with one or more terminal devices (for example, a terminal device #1 and a terminal device #2 shown in FIG. 1). The network device may be a base station, may be a device obtained after a base station and a base station controller are integrated, or may be another device having a similar communication function.

The wireless communications system in this embodiment includes, but is not limited to, a narrow band-internet of things (narrow band-internet of things, NB-IoT) system, a global system for mobile communications (global system for mobile communications, GSM), an enhanced data rate for GSM evolution (enhanced data rate for GSM evolution, EDGE) system, a wideband code division multiple access (wideband code division multiple access, WCDMA) system, a code division multiple access 2000 (code division multiple access, CDMA2000) system, a time division-synchronous code division multiple access (time division-synchronization code division multiple access, TD-SCDMA) system, a long term evolution (long term evolution, LTE) system, three application scenarios of a next-generation 5G mobile communications system: enhance mobile broadband (enhance mobile broadband, eMBB), ultra-reliable low latency communication (ultra reliable low latency communication, URLLC), and enhanced massive machine type communication (massive machine type communication, eMTC), or a future new communications system.

The terminal device in this embodiment may include various hand-held devices, vehicle-mounted devices, wearable devices, or computing devices that have a wireless communication function, or other processing devices connected to a wireless modem. The terminal device may be a mobile station (mobile station, MS), a subscriber unit (subscriber unit), a cellular phone (cellular phone), a smart phone (smart phone), a wireless data card, a personal digital assistant (personal digital assistant, PDA) computer, a tablet computer, a wireless modem (modem), a handset (handset), a laptop computer (laptop computer), a machine type communication (machine type communication, MTC) terminal, or the like.

A wireless technology is used for communication between the network device and the terminal devices in FIG. 1. When sending a signal, the network device is an encoder; and when receiving a signal, the network device is a decoder. Similarly, when sending a signal, the terminal device is an encoder; and when receiving a signal, the terminal device is a decoder.

In addition, the encoder may be considered as a transmit end, and the decoder may be considered as a receive end.

Figure 2:
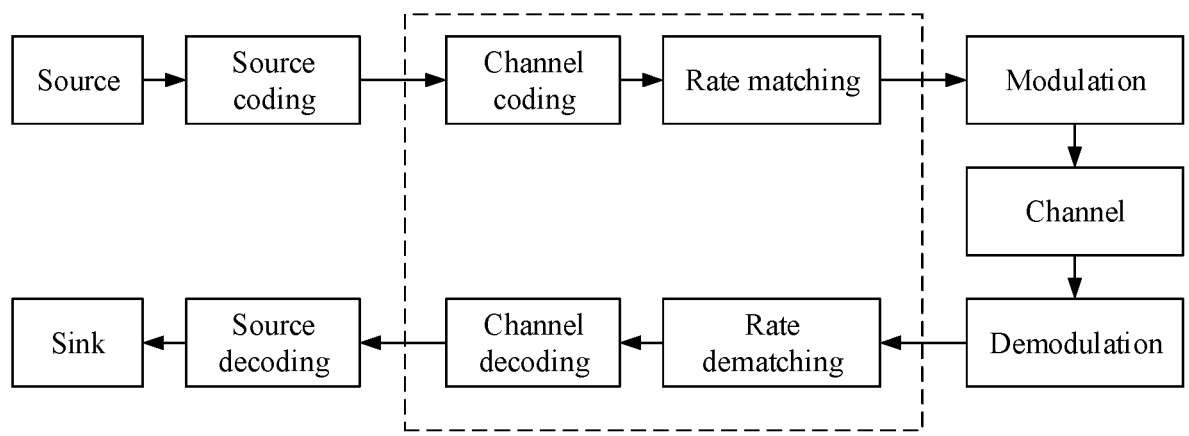
FIG. 2 is a basic flowchart of communication performed by using a wireless technology.

FIG. 2 is a basic flowchart of communication performed by using a wireless technology. As shown in FIG. 2, after source coding, channel coding, rate matching, and modulation are sequentially performed on a source of the transmit end, the source is sent on a channel. After receiving the signal, the receive end sequentially performs demodulation, rate de-matching, channel decoding, and source decoding to obtain a sink.

For ease of understanding, related technologies herein are briefly described first.

(1) Channel Coding

Channel coding/decoding is one of core technologies in the wireless communications field, and performance improvement of the technology directly enhances network coverage and increases a user transmission rate. Currently, a polar code is a channel coding technology that is theoretically proved to be capable of achieving a Shannon capacity and that has practical coding and decoding capabilities with linear complexity. A core of polar code construction is to use "channel polarization". On an encoder side, subchannels present different reliability by using a coding method. When a code length continuously increases, some channels tend to become noiseless channels having a capacity close to 1, and other channels tend to become pure noisy channels having a capacity close to 0. A channel having a capacity close to 1 is selected to directly transmit information, so as to approach the channel capacity.

A coding policy for a polar code exactly applies a feature of the phenomenon. Useful information of a user is transmitted on a noiseless channel, and agreed information or no information is transmitted on a pure noisy channel. The polar code is also a linear block code. A coding matrix (also referred to as a generation matrix) of the polar code is $F_N$, and a coding process is $x_1^N = u_1^N \cdot F_N$. $u_1^N = (u_1, u_2, \ldots, u_N)$ is a binary row vector whose length (that is, a code length) is N, $N=2^n$, and n is a positive integer. $F_N$ is an N×N matrix, and $F_N = F_2^{\otimes (\log_2 N)}$. $F_2^{\otimes (\log_2 N)}$ is defined as a Kronecker (Kronecker) product of $\log_2 N$ matrices $F_2$.

$$F_2 = \begin{bmatrix} 1 & 0 \\ 1 & 1 \end{bmatrix}.$$

The foregoing addition and multiplication operations in the formulas are all addition and multiplication operations in a binary Galois field.

In the coding process of the polar code, some bits in $u_1^N$ are used to carry information, and are referred to as an information bit set. A set of indexes of these bits is denoted as A. Other bits are set to fixed values predetermined on a receive end and a transmit end and are referred to as a fixed bit set or a frozen bit (frozen bits) set, and a set of indexes of the bits is denoted as a complementary set $A^c$ of A. The coding process of the polar code is equivalent to $x_1^N = u_A F_N(A) \oplus u_{A^c} F_N(A^c)$. Herein, $F_N(A)$ is a submatrix, in $F_N$, derived from rows corresponding to the indexes in the set A. $F_N(A^c)$ is a submatrix, in $F_N$, derived from rows corresponding to the indexes in the set $A^c$. $u_A$ is the information bit set in $u_1^N$, and a quantity of information bits is K. $u_{A^c}$ is the fixed bit set in $u_1^N$, a quantity of fixed bits is N−K, and the fixed bits are known bits. The fixed bits are generally set to 0. However, the fixed bits may be set randomly provided that the receive end and the transmit end have pre-agreed. Therefore, a coding output of the polar code may be simplified as $x_1^N = u_A \cdot F_N(A)$. Herein, $u_A$ is the information bit set in $u_1^N$, and $u_A$ is a row vector having a length of K, in other words, |A|=K. The symbol || represents a quantity of elements in a set, K is a size of an information block, $F_N(A)$ is the submatrix, in $F_N$, derived from the rows corresponding to the indexes in the set A, and $F_N(A)$ is an N×N matrix.

(2) Higher Order Modulation

An inherent feature of the higher order modulation is that bit reliability depends on a mapping relationship of a modulation constellation map, and bits mapped to a same modulation symbol have different reliability. In other words, different bits mapped to a same modulation symbol are protected at different degrees. For example, for 16QAM, an order of protection levels Q(bi) of four bits $b_i$ mapped to one modulation symbol is $Q(b_1)=Q(b_2)>Q(b_3)=Q(b_4)$, where $i \in \{1,2,3,4\}$. For another example, for 64QAM, an order of protection levels Q(bi) of six bits $b_i$ mapped to one modulation symbol is $Q(b_1)=Q(b_2)>Q(b_3)=Q(b_4)>Q(b_5)=Q(b_6)$. It can be easily figured out that a bit having a lower protection level is more likely to be distorted in a transmission process, causing a burst error in a decoding process. Therefore, such a feature of the higher order modulation is obviously adverse to an error-correcting code (including a polar code).

(3) Interleaving Technology

On a fading channel, errors often occur in strings, and channel coding is effective only in detecting and correcting a single error or a short string of errors. To resolve a problem of strings of bit errors, the interleaving technology is proposed in the prior art. In the interleaving technology, an original data sequence is disrupted, so that correlation between a data sequence before interleaving and a data sequence after interleaving is reduced. In this way, even if errors occur in strings in a transmission process, when a data sequence before interleaving is restored, the errors become a single error bit. In addition, because the channel has an error correction capability, a probability of restoring the original data sequence increases, and a probability of a data burst error decreases. Therefore, an anti-interference capability in data transmission can be improved.

Currently, common interleaving methods include row-column interleaving and random interleaving.

In the row-column interleaving, a $Z_1 \times Z_2$ matrix is generated based on a code length obtained after coding. An original bit sequence is interleaved based on a "row-in-column-out" operation or a "column-in-row-out" operation, to obtain an interleaved bit sequence.

Figure 3:
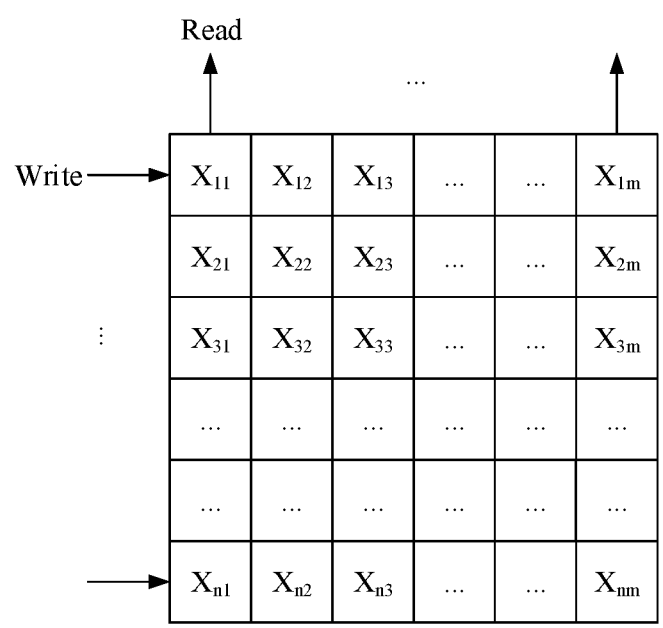
FIG. 3 is a schematic diagram of row-column interleaving.

FIG. 3 is an example schematic diagram of row-column interleaving. In FIG. 3, "row-in-column-out" is used as an example, an original bit sequence is $[X_{11}, X_{12}, X_{13}, \ldots, X_{1m}, X_{21}, X_{22}, X_{23}, \ldots, X_{2m}, \ldots, X_{n1}, X_{n2}, X_{n3}, \ldots, X_{nm}]$, and an interleaved sequence is $[X_{11}, X_{21}, X_{31}, \ldots, X_{n1}, X_{12}, X_{22}, X_{32}, \ldots, X_{n2}, \ldots, X_{1m}, X_{2m}, X_{3m}, \ldots, X_{nm}]$.

If the simple row-column interleaving is used for a polar code, in higher order modulation, a burst error cannot be randomized, and impact, on decoding performance, of different protection levels of different bits in the higher order modulation cannot be offset.

Therefore, this application provides an interleaving method, to improve error correction performance of the polar code in higher order modulation.

To better understand a design concept of this application, quasi periodicity of the polar code is described first.

Reliability of polarized channels of a polar code presents quasi periodicity with numbers of the polarized channels. Normalization reliability of the polarized channels is described by using a polar code construction sequence used in new radio (new radio, NR) in 3GPP. For a trend in which reliability of polarized channels whose mother code length is 1024 varies with channel numbers, refer to FIG. 4. For a trend in which channel numbers of polarized channels whose mother code length is 256 vary, refer to FIG. 5.

It should be noted that the normalization reliability may be described as follows (the description is given by using N polarized channels): computing reliability of the N polarized channels, and quantizing (or normalizing) the reliability of the N polarized channels to obtain a quantized value of the reliability of each polarized channel. For example, N=1024, a largest quantized value among the N quantized values is set to 1023, a second largest quantized value is set to 1022, and the rest can be deduced by analogy until a smallest quantized value is set to 0. In this case, an obtained sorting sequence of reliability is a sorting sequence of normalization reliability of the N polarized channels. For another example, N=128, a largest quantized value among the N quantized values is set to 127, a second largest quantized value is set to 126, and the rest can be deduced by analogy until a smallest quantized value is set to 0. For still another example, N=1024, and the N quantized values each are divided by a largest quantized value among the N quantized values. Then, the largest value among the N quantized values is 1. Quantized values of reliability of the channels range from 0 to 1.

Figure 4:
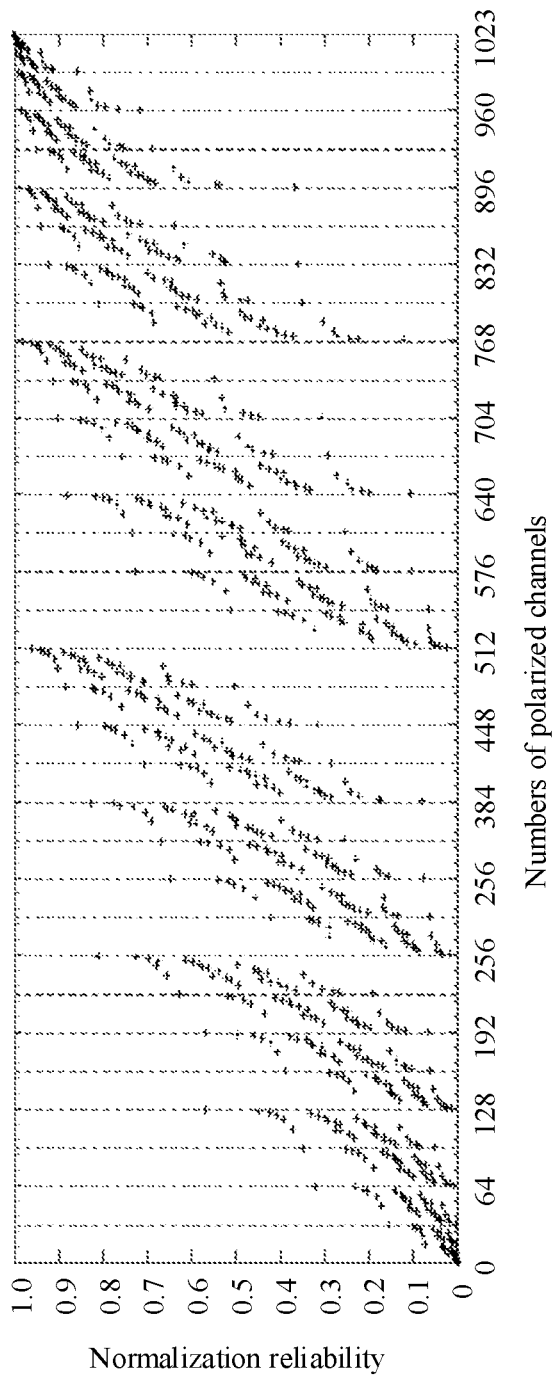
FIG. 4 is a schematic diagram of quasi periodicity of a polar code.
Figure 5:
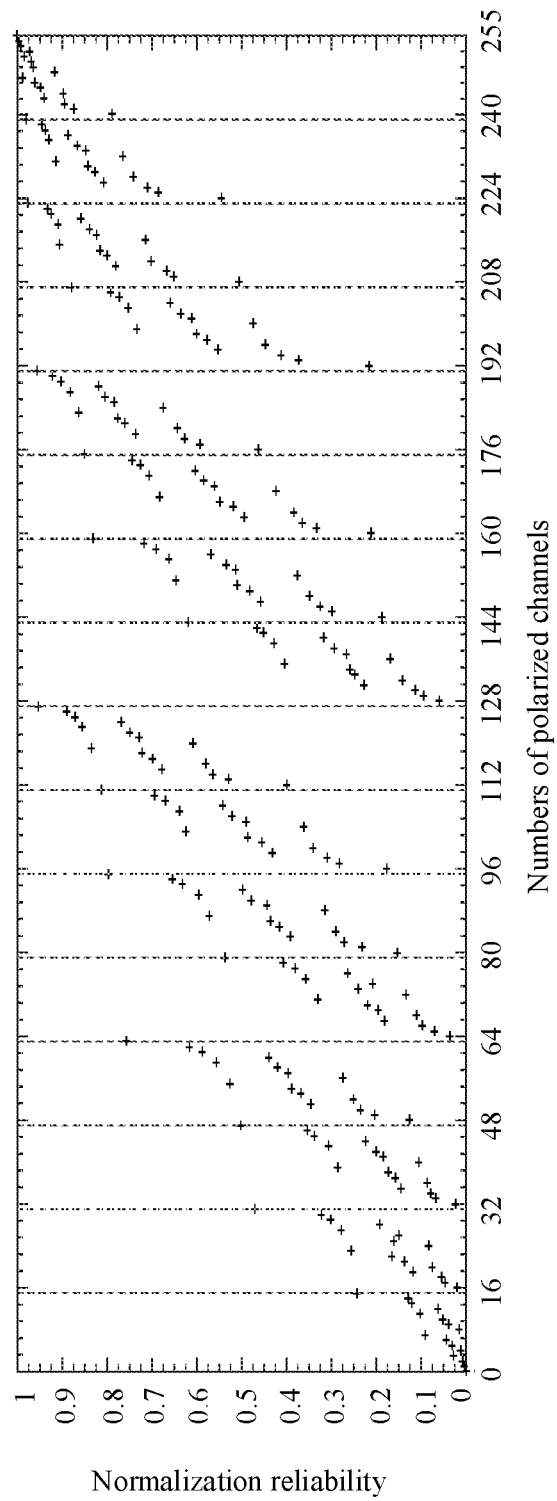
FIG. 5 is another schematic diagram of quasi periodicity of a polar code.

FIG. 4 and FIG. 5 present a similar trend in which reliability of polarized channels varies with channel numbers. FIG. 4 is equivalent to four FIG. 5. A mother code scale in which a length is 1024 is used as an example. Four periods are included, each period includes 256 polarized channels, and average reliability of polarized channels in a current period is higher than that in a previous period. Referring to FIG. 5, it may be found that polarized channels have different scale periods. In each period, reliability of polarized channels increases with an increase of channel numbers, and average reliability in a current period is higher than that in a previous period. In FIG. 5, 32 subchannels are used as one period (a period interval is marked by using a dashed line). In each period, reliability of polarized channels increases in general. If eight subchannels are used as one period, for example, [0,7] or [8,15], reliability of the eight subchannels also increases. In addition, average reliability in each period is improved relative to average reliability in a previous period. In this quasi-periodic change, two polarized channels may be used as one period (or referred to as a polarization period or a quasi-polarization period) at minimum.

Considering that the polar code has quasi periodicity that other error-correcting codes do not have, this application proposes an interleaving method, to improve error correction performance of the polar code based on a difference between protection levels of different bits for a modulation symbol of higher order modulation.

It can be learned from the foregoing description that in a higher-order modulation scheme (for example, 16QAM or 64QAM), modulation protection levels of consecutively input bits are different. Therefore, in an embodiment of this application, bits in one polarization period need to be prevented from being mapped to one higher order modulation symbol for transmission. Using 16QAM as an example, each modulation symbol includes four bits of information. Therefore, four consecutive bits having ascending or descending polarization degrees in one polarization period need to be prevented from being all allocated to one modulation symbol.

Based on such a design concept, the present disclosure proposes a plurality of interleaving manners. In various embodiments, an original bit sequence before interleaving is denoted as a first bit sequence, and a bit sequence after interleaving is denoted as a second bit sequence. The second bit sequence may also be referred to as an interleaved sequence or a bit sequence after interleaving.

It should be understood that a quantity of bits included in a bit sequence does not change before and after interleaving. To be specific, if the first bit sequence includes L number of bits, the second bit sequence obtained after the interleaving also includes L number bits, where L is a positive integer.

Figure 6:
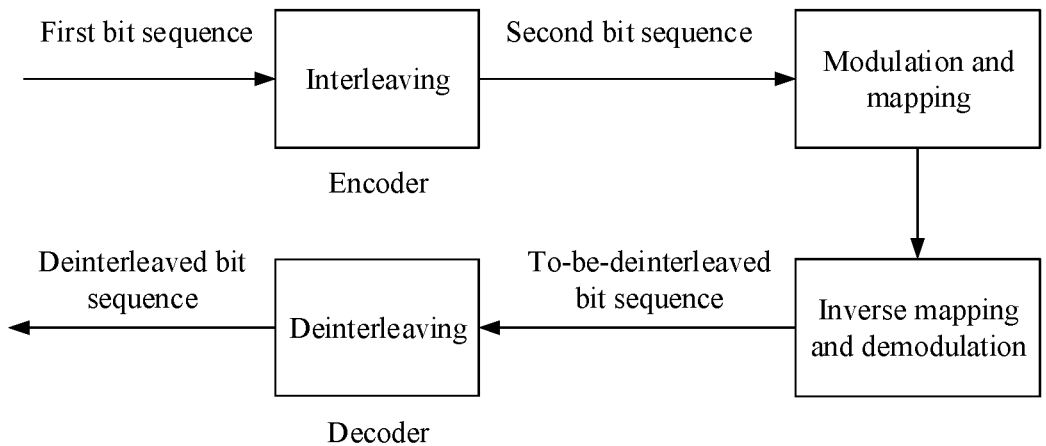
FIG. 6 is a schematic flowchart of interleaving and deinterleaving.

FIG. 6 is a schematic diagram of interleaving and deinterleaving. An encoder obtains a first bit sequence, where the first bit sequence includes L number of bits, and L is a positive integer; writes the L number of bits included in the first bit sequence into an interleaving matrix according to a preset write rule; and then, reads, according to a preset read rule, the L number of bits written into the interleaving matrix, to obtain a second bit sequence, so that an interleaving process is completed. The second bit sequence includes L number of bits, and the interleaving matrix includes C rows and R number of columns, where C and R are positive integers. After modulating and mapping the second bit sequence, a transmit end sends the second bit sequence. After performing inverse mapping and demodulation, a decoder obtains a to-be-deinterleaved bit sequence, and deinterleaves the to-be-deinterleaved bit sequence, to obtain a deinterleaved bit sequence.

In an ideal noiseless case, the deinterleaved bit sequence is the same as the first bit sequence.

Usually, a code length of a polar code before rate matching is referred to as a mother code length, and is denoted as N. A code length of a polar code after rate matching is denoted as M. In the interleaving method provided in this application, a length of the first bit sequence (or a value of L) may be the length M after rate matching during polar coding, in other words, L=M; or may be the mother code length N before rate matching, and in this case, L=N.

In addition, in this specification, some embodiments are described by using "column-in-row-out" as an example, and other embodiments are described by using "row-in-column-out" as an example. It may be understood that, in a row-column interleaving process, "row" and "column" are relative. Therefore, a person skilled in the art easily obtains an interleaving process of "column-in-row-out" according to an embodiment of "row-in-column-out". Similarly, an interleaving process of "row-in-column-out" may be deduced according to the interleaving process of "column-in-row-out". Therefore, "row-in-column-out" and "column-in-row-out" in each embodiment are not described in detail in the following embodiments. In each embodiment, a person skilled in the art may obtain one interleaving manner based on another described interleaving manner.

Row-column interleaving is used in this embodiment. In row-column interleaving, a quantity of rows of an interleaving matrix (which may also be referred to as an interleaver) is denoted as C below, and a quantity of columns of the interleaving matrix is denoted as R below. C and R are positive integers.

In this embodiment, the write rule includes a plurality of manners, which are described one by one in detail below.

Manner 1

The L number of bits are written into at least one interleaving unit of the interleaving matrix, where each column includes B number of bits, and each interleaving unit includes B number of rows and R number of columns. B is a positive integer.

In this embodiment, the interleaving unit is a part of the interleaving matrix, and usually, is also a matrix. It should be noted that sizes of an interleaving unit may be different in different embodiments. Alternatively, in one embodiment, one interleaving matrix may include several interleave units of different sizes. For details about the size of the interleaving unit, refer to descriptions in various embodiments.

If writing is performed into an interleaving unit by row, a quantity of bits written into each row may also be referred to as an interleaving depth of the interleaving unit. If writing is performed into an interleaving unit by column, a quantity of bits written into each column is referred to as an interleaving depth of the interleaving unit.

In addition, the L number of bits are to-be-interleaved bits. Therefore, in some embodiments, the L number of bits are described as "to-be-interleaved bits".

Figure 7:
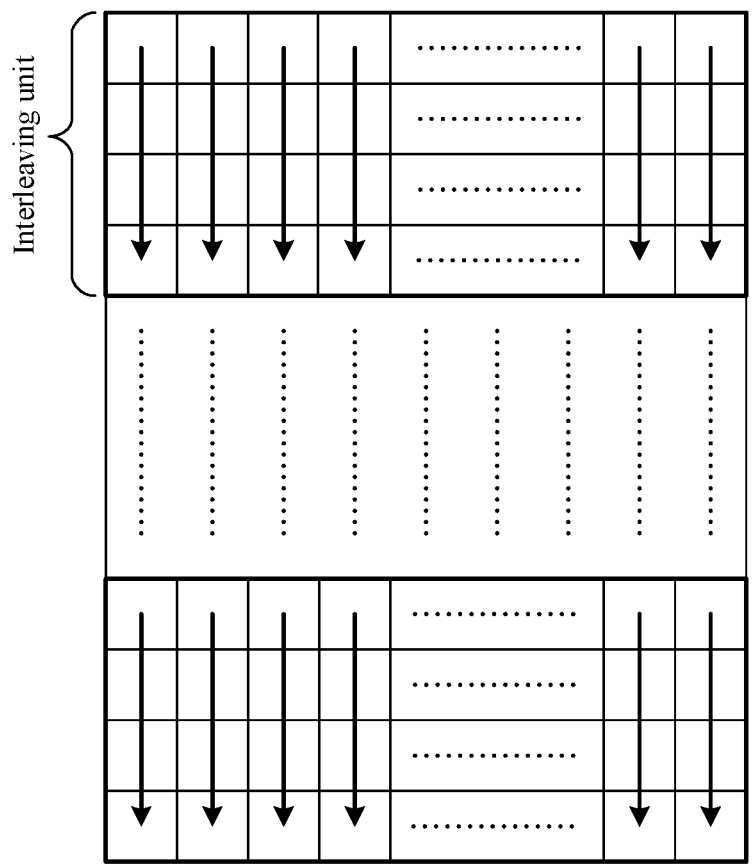
FIG. 7 shows an example of a write rule.

FIG. 7 shows an example of the write rule. B number of bits are written into each column, B is a constant value, and then writing is performed into another column. When writing into the entire interleaving matrix is completed, writing continues to be performed column by column from a $(B+1)^{th}$ row, and B number of bits are written into each column.

In this embodiment, a value of the quantity C number of rows of the interleaving matrix is equal to a quantity C of constellation points. The quantity of constellation points satisfies that C=2M, where M is a modulation order, and M is a positive integer.

The quantity R number of columns of the interleaving matrix may be calculated based on the code length N before rate matching, or may be calculated based on the code length M after rate matching.

If calculation is performed based on the code length N (namely, the mother code length) before rate matching, $R=\lceil N/C \rceil$.

If calculation is performed based on the code length M after rate matching, $R=\lceil M/C \rceil$.

A value of B may be a function of a polarization period, for example, $B=2^n$, where n=1, 2, 3, . . . , or $2^{\lceil log_2 N \rceil}$.

Alternatively, B may be a function of M or C. For example, $B=\lceil \alpha(log_2 C)+\beta \rceil$, $B=\lceil \alpha \cdot (log_2 C+\beta) \rceil$, or $B=\lfloor \alpha \cdot M+\beta \rfloor$.

A value range of $\alpha$ is (0, 2), a value range of $\beta$ is (−2, +2), $\lceil \ \rceil$ represents rounding up, and $\lfloor \ \rfloor$ represents rounding down.

For example, when $\alpha=0.5$ and $\beta=0$, if M=4, B is 8; and if M=6, B is 32.

It should be noted that in a process of performing writing into the interleaving matrix, when the L number of bits are all written into the interleaving matrix but the interleaving matrix is still not fully filled, NULL is written at a position without a bit.

When B is calculated based on the code length N before rate matching, the following code may be used for implementation:

B=32; % setting a smallest unit size in group division
rowNum=ConsNum; % a quantity of rows of an interleaver is equal to a quantity of constellation points in a modulation scheme
colNum=rounding up (N/ConsNum); % calculating a quantity of columns based on a length after coding
groupNum=rounding up (N/B); % a minimum quantity of units
lgroupNum=groupNum−(rowNum/−1)*colNum; % calculating a quantity of units into which NULL needs to be written
ind=1:rowNum*colNum; % generating initial numbers of elements of an interleaving matrix
indT=filling, by column, number vectors into a matrix having B number of rows and groupNum columns; % generating a to-be-interleaved matrix
indTT=[ ]; % generating an initial value of the interleaving matrix
for n=1:rowNum % interleaving
if n=rowNum % filling NULL to the last unit
lgroupind=generating a unit including the element NULL;
indTT=filling the newly generated unit below the interleaving matrix;
else
indTT=filling the newly generated unit below the interleaving matrix;
end
end
seq=reshape (indTT', 1, rowNum*colNum);
seq=seq (seq≤N)

When B is calculated based on the code length M after rate matching, the following code may be used for implementation:

B=8; % setting a smallest unit size
rowNum=ConsNum; % a quantity of rows of an interleaver is equal to a quantity of constellation points in a modulation scheme
N0=2^(rounding up (log 2(N))); % obtaining a mother code length N0
colNum=rounding up (N0/ConsNum); % obtaining a quantity of columns of the interleaver
groupNum=rounding up (N0/); % obtaining a quantity of smallest units B
ind=1:N0; % obtaining a number
ind (puncturing/shortening)=0; % setting, to 0, a channel shortened or punctured in rate matching
ind=reverse (ind);
indT=filling, by column, number vectors into a matrix having B number of rows and groupNum columns;
indTT=[ ];

for n=1:rowNum % performing segmentation by unit, and performing filling into the interleaving matrix
  indTT=filling a newly generated unit below the interleaving matrix;
 end
 seq=reading the interleaving matrix by row;
 seq=seq (seq>0); % finishing rate matching
 [sorted number, interleaved sequence]=sorting in ascending order (seq); % obtaining an interleaved sequence After the L number of bits included in the first bit sequence are written into the interleaving matrix according to the write rule described in the manner 1, bits written into any row of the interleaving matrix are discontinuous in the first bit sequence, and bits written into any column of the interleaving matrix are discontinuous in the first bit sequence either.

It should be noted that after the L number of bits included in the first bit sequence are written into the interleaving matrix, a feature presented in the interleaving matrix is actually an external expression of the interleaving method provided in this application.

Manner 2

The L number of bits are written into at least two interleaving units of the interleaving matrix, the at least two interleaving units include different quantities of rows, and each interleaving unit includes R number of columns.

Figure 8:
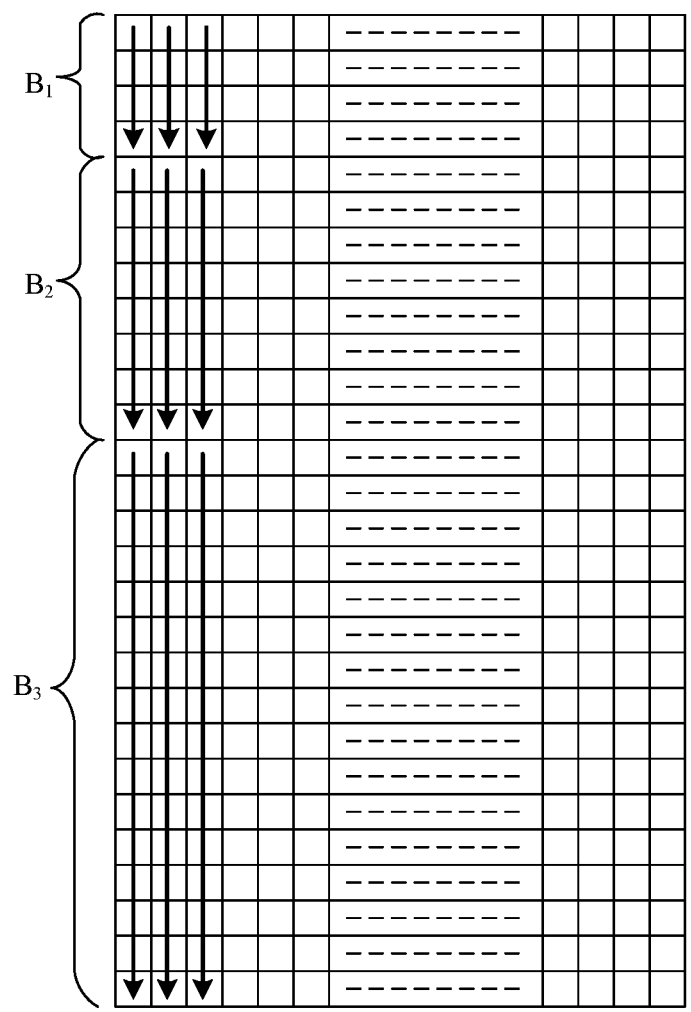
FIG. 8 shows another example of a write rule.

FIG. 8 shows another example of the write rule. An $i^{th}$ interleaving unit of the interleaving matrix includes $B_i$ number of rows and R number of columns. When writing is performed into the $i^{th}$ interleaving unit, $B_i$ number of bits are written into each column, where $B_i$ is a positive integer.

For example, FIG. 8 shows three interleaving units. The first interleaving unit includes four rows and R number of columns, the second interleaving unit includes eight rows and R number of columns, and the third interleaving unit includes 16 rows and R number of columns. In other words, $B_1=4$, $B_2=8$, and $B_3=16$.

In this embodiment, a total quantity $$\sum_i B_i$$

of rows of the interleaving matrix satisfies a relation $$\sum_i B_i \leq C,$$

where C is a quantity of constellation points.

The quantity R of columns may be calculated based on the mother code length N before rate matching, or may be calculated based on the code length M after rate matching. Similarly, if the quantity R of columns is calculated based on the code length N before rate matching, $R=\lceil N/C \rceil$; or if the quantity R of columns is calculated based on the code length M after rate matching, $R=\lceil M/C \rceil$.

Similarly, if all the L number of bits are written into the interleaving matrix, but the interleaving matrix is still not fully filled, NULL is written at a position without a bit.

As can be learned, in the manner 2, interleaving units having at least two depths exist in the interleaving matrix. After the L number of bits included in the first bit sequence are written into the interleaving matrix according to the write rule described in the manner 2, bits written into any row of the interleaving matrix are discontinuous in the first bit sequence, and bits written into any column of the interleaving matrix are discontinuous in the first bit sequence either.

Manner 3

The L number of bits are written into a first interleaving unit and a second interleaving unit of the interleaving matrix. In the interleaving matrix, the first interleaving unit is arranged first, and then the second interleaving unit is arranged. Alternatively, the first interleaving unit and the second interleaving unit may be arranged in a cross manner.

The cross arrangement herein includes alternate arrangement of the first interleaving unit and the second interleaving unit. Alternatively, $m_1$ first interleaving units are arranged first, and then $n_1$ second interleaving units are arranged. Subsequently, $m_2$ first interleaving units are arranged, then $n_2$ second interleaving units are arranged, and so on. $m_1$, $m_2$, $n_1$, and $n_2$ are positive integers, and respective values are not limited.

Figure 9:
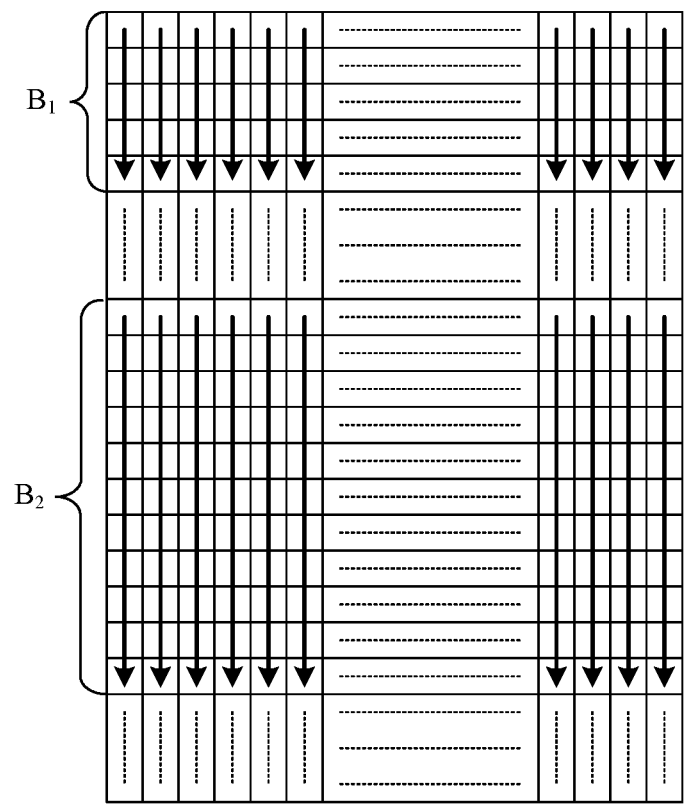
FIG. 9 shows an arrangement form of interleaving units having two interleaving depths in an interleaving matrix.

FIG. 9 shows an arrangement form of interleaving units having two interleaving depths in an interleaving matrix. An interleaving depth of the first interleaving unit is denoted as $B_1$, and an interleaving depth of the second interleaving unit is denoted as $B_2$. $B_1$ and $B_2$ are positive integers. In the arrangement manner shown in FIG. 9, in the interleaving matrix, $U_1$ first interleaving units are arranged first, and then $U_2$ second interleaving units are arranged, where $U_1$ and $U_2$ are positive integers.

A quantity of bits written into the first interleaving unit is approximately equal to a quantity of bits written into the second interleaving unit, in other words, $U_1 \times B_1 \times R = U_2 \times B_2 \times R$, where R is the quantity of columns of the interleaving matrix. In an example, the two interleaving depths may be: $B_1=5$ and $B_2=11$, $B_1=3$ and $B_2=5$, $B_1=3$ and $B_2=7$, $B_1=3$ and $B_2=11$, $B_1=5$ and $B_2=7$, or $B_1=7$ and $B_2=11$.

A method for determining $U_1$ and $U_2$ is: $U_1=B_2$ and $U_2=B_1$. In this case, $R=\lceil M/(U_1 \cdot B_1 + U_2 \cdot B_2) \rceil$.

A quantity of to-be-interleaved bits allocated to each of the first interleaving unit and the second interleaving unit may be determined by using the following method: A length of bits allocated to the first interleaving unit satisfies that $M_1=\lceil M/2 \rceil$, and a length of bits allocated to the second interleaving unit satisfies that $M_2=M-M_1$. Alternatively, a length of bits allocated to the first interleaving unit satisfies that $M_1=\lceil M/2 \rceil+1$, and a length of bits allocated to the second interleaving unit satisfies that $M_2=M-M_1$.

An interleaving process may be expressed as follows:

To-be-interleaved bits [1, 2, 3, 4, ..., M] are divided into two groups, the first group is [1, 2, 3, 4, ..., $M_1$], and the second group is [$M_1+1$, $M_1+2$, ..., $M_2$].

The first group of to-be-interleaved bits are written into the $1^{st}$ first interleaving unit column by column, and a write depth in each time of writing is $B_1$ (that is, $B_1$ bits are written into each column). Each time writing into a column is completed, writing is performed into another column. After R number of columns are fully written, writing is performed into the $2^{nd}$ first interleaving unit. This process is repeated until all the $M_1$ bits are written. In this case, if there is still a part that is not fully filled in the $U_1$ first interleaving units, NULL is written at a position without a bit, to fully fill the $U_1$ first interleaving units.

The second group of to-be-interleaved bits are written into the $1^{st}$ second interleaving unit column by column, and a write depth in each time of writing is $B_2$. Each time writing into a column is completed, writing is performed into another column. After R number of columns are fully written, writing is performed into the $2^{nd}$ second interleaving unit. This process is repeated until all the $M_2$ bits are written. In this case, if the second interleaving units are still not fully filled, NULL is written at a position without a bit, to fully fill the $U_2$ second interleaving units.

In some embodiments, before reading, row transformation may be performed on an interleaver. For example, transformation is performed by using a bit reversal method or in an odd-even exchange manner.

The bits in the interleaving matrix are read, as an interleaved sequence, row by row during reading.

Alternatively, reading may be simultaneously performed from different interleaving units during reading. For example, reading is performed downward row by row from left to right from a start point of the first interleaving unit, at the same time, reading is performed upward row by row from right to left from an end point of the second interleaving unit. NULL is skipped during reading. After parallel-to-serial conversion is performed on bit sequences read from the first interleaving unit and the second interleaving unit, the bit sequences are used as a final output interleaved sequence.

After the L number of bits included in the first bit sequence are written into the interleaving matrix according to the write rule described in the manner 3, bits written into any row of the interleaving matrix are discontinuous in the first bit sequence, and bits written into any column of the interleaving matrix are discontinuous in the first bit sequence either.

Manner 4

The L number of bits are written into interleaving units of an interleaving matrix that have G interleaving depths. The interleaving matrix includes one interleaving unit whose interleaving depth is $B_1$, one interleaving unit whose interleaving depth is $B_2, \ldots$, and one interleaving unit whose interleaving depth is $B_G$, where $B_1, B_2, \ldots$, and $B_G$ are positive integers.

In this embodiment, the quantity of columns of the interleaving matrix satisfies that $$R = \left\lceil M \bigg/ \left( \sum_{i=1}^{G} B_i \right) \right\rceil.$$

A quantity of bits allocated to an interleaving unit whose interleaving depth is $B_i$ satisfies that $M_i = R \times B_i$. When i=G, that is, when a quantity of bits of the last interleaving unit whose interleaving depth is $B_G$ satisfies that $$M_G = M - \sum_{i}^{G-1} M_i,$$

a value of B may be 3, 5, 7, 9, 11, or the like.

For ease of understanding, the following describes an interleaving process in this embodiment by using an example in which G=2, that is, two interleaving units having two interleaving depths exist in the interleaving matrix.

Figure 10:
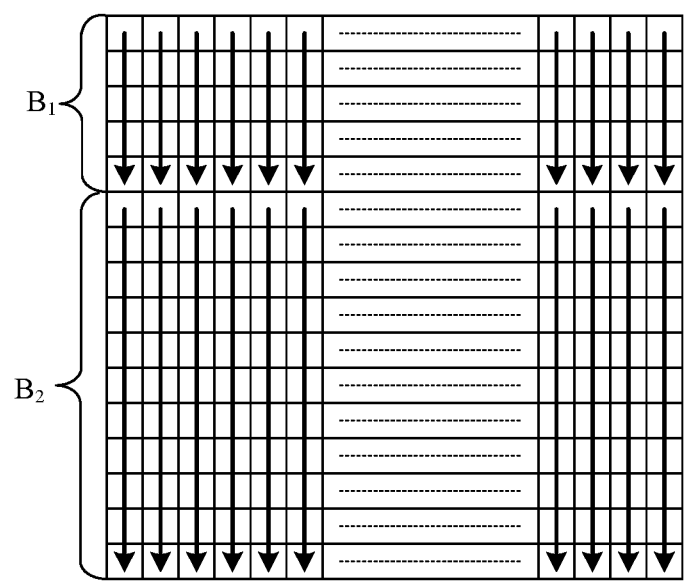
FIG. 10 shows another arrangement form of interleaving units having two interleaving depths in an interleaving matrix.

For the write rule described in the manner 4, refer to FIG. 10. FIG. 10 shows another arrangement form of interleaving units having two interleaving depths in an interleaving matrix. As shown in FIG. 10, the interleaving matrix includes a first interleaving unit and a second interleaving unit. An interleaving depth of the first interleaving unit is denoted as $B_1$ below, and an interleaving depth of the second interleaving unit is denoted as $B_2$ below. $B_1$ and $B_2$ are positive integers. For example, $B_1$=5 and $B_2$=11. As shown in FIG. 10, in the interleaving matrix, the first interleaving unit may be arranged first, and then the second interleaving unit is arranged.

In this embodiment, the total quantity R of columns of the interleaving matrix may be determined by using an expression $R=\lceil M/(B_1+B_2) \rceil$. A quantity of bits allocated to the first interleaving unit satisfies that $M_1=R \times B_1$, and a quantity of bits allocated to the second interleaving unit satisfies that $M_2=M-M_1$.

In some embodiments, the interleaving process may be expressed as follows:

To-be-interleaved bits $[1, 2, 3, 4, \ldots, M]$ are divided into two groups, the first group is $[1, 2, 3, 4, \ldots, M_1]$, and the second group is $[M_1+1, M_1+2, \ldots, M_2]$. The first group of to-be-interleaved bits are written into the first interleaving unit column by column, and a write depth in each time of writing is $B_1$ (that is, $B_1$ bits are written into each column). Each time writing into a column is completed, writing is performed into another column. This process is repeated until all the $M_1$ bits are written into the first interleaving unit. In this case, if there is still a part that is not fully filled in the first interleaving unit, NULL is written at a position without a bit.

The second group of to-be-interleaved bits are written into the second interleaving unit column by column, and a write depth in each time of writing is $B_2$. Each time writing into a column is completed, writing is performed into another column. This process is repeated until all the $M_2$ bits are written into the second interleaving unit. In this case, if the second interleaving unit is still not fully filled, NULL is written at a position without a bit.

The interleaving matrix is read row by row during reading. Alternatively, reading may be simultaneously performed row by row from different interleaving units. After parallel-to-serial conversion is performed on read bits, the read bits are output as an interleaved sequence (that is, the second bit sequence).

When reading is performed row by row, directions of row-by-row reading may be different. One row may be read from left to right, and all rows are read from top to bottom. Another row is read from right to left, and all rows are read from bottom to top.

Similar to the manner 3, row transformation may be performed on the interleaving matrix before reading. For example, row transformation is performed by using a bit reversal method or in an odd-even exchange manner.

According to the write rule and the read rule that are described in the manner 4, parallel reading and writing may be performed for interleaving units having various interleaving depths, to improve an interleaving speed.

Figure 11:
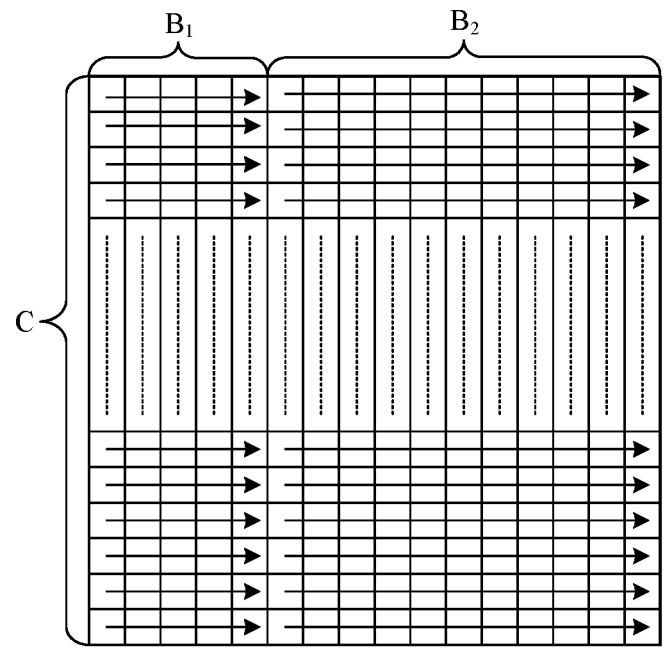
FIG. 11 is a schematic diagram of performing, in rows, writing into interleaving units having two interleaving depths.

It may be understood that in the manner 4, interleaving may alternatively be performed in a "row-in-column-out" manner. FIG. 11 is a schematic diagram showing that the first bit sequence is written, by row, into interleaving units having two interleaving depths.

A process of performing writing by row may be expressed as follows:

To-be-interleaved bits $[1, 2, 3, 4, \ldots, M]$ are divided into two groups, the first group is $[1, 2, 3, 4, \ldots, Mt]$, and the second group is $[M_1+1, M_1+2, \ldots, M_2]$.

The first group of to-be-interleaved bits are written into a first interleaving unit row by row, and a write depth in each time of writing is $B_1$. This process is repeated until the first group of $M_1$ to-be-interleaved bits are all written. If the first interleaving unit has a part that is not fully filled, NULL is written at a position without a bit.

The second group of to-be-interleaved bits are written into a second interleaving unit row by row, and a write depth in each time of writing is $B_2$. This process is repeated until the second group of $M_2$ to-be-interleaved bits are all written. If the second interleaving unit has a part that is not fully filled, NULL is written at a position without a bit.

Figure 12:
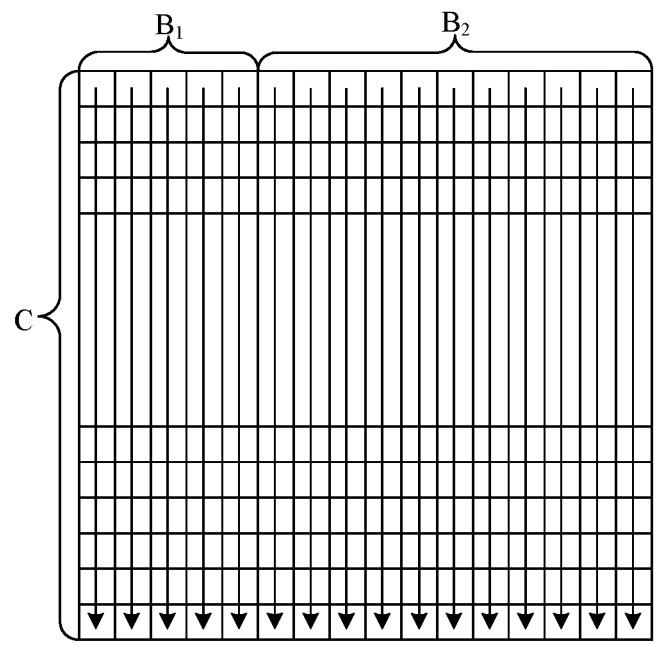
FIG. 12 shows an example of a read rule.

For a read manner, refer to FIG. 12. FIG. 12 shows an example of the read rule. Reading is performed column by column from left to right.

Figure 13:
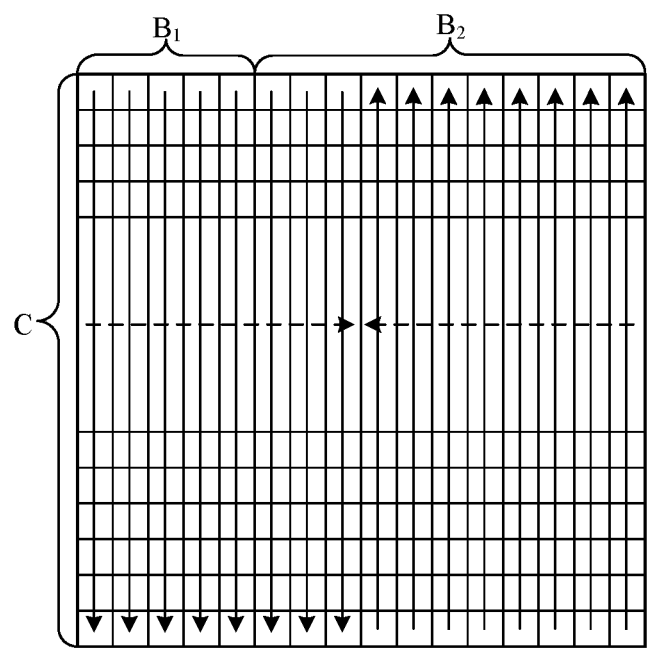
FIG. 13 shows an example of a parallel read mode of interleaving units having different interleaving depths.

During reading, parallel reading may be performed from two interleaving units having different interleaving depths. One of implementations is shown in FIG. 13. FIG. 13 shows an example of a parallel read mode of interleaving units having different interleaving depths. As shown in FIG. 13, reading is performed from a start point of a first interleaving unit rightward column by column from top to bottom, and at the same time, reading is performed from a start point of a second interleaving unit leftward column by column from bottom to top. NULL is skipped during reading. After parallel-to-serial conversion is performed on read data, the read data is used as an output interleaved sequence.

In some embodiments, before reading, column transformation may be performed on an interleaver. The column transformation includes odd-even exchange, bit reversal transformation, and the like.

After the L number of bits included in the first bit sequence are written into the interleaving matrix according to the write rule described in the manner 4, bits written into any row of the interleaving matrix are discontinuous in the first bit sequence, and bits written into any column of the interleaving matrix are discontinuous in the first bit sequence either.

Manner 5

The L number of bits are written into the interleaving matrix column by column, and a quantity of bits written into each column is different.

Figure 14:
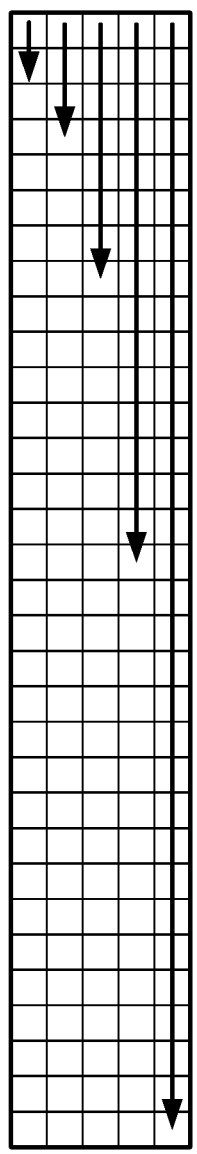
FIG. 14 shows still another example of a write rule.

FIG. 14 shows still another example of the write rule. As shown in FIG. 14, the L number of bits are written into the interleaving matrix column by column, two bits are written into the first column, four bits are written into the second column, eight bits are written into the third column, 16 bits are written into the fourth column, and 32 bits are written into the fifth column.

In this embodiment, the total quantity of rows of the interleaving matrix is equal to a quantity of bits written into a column that has a largest quantity of written bits. For example, when the L number of bits are written into the interleaving matrix, if $B_1$ bits are written into the first column, $B_2$ bits are written into the second column, . . . , and $B_C$ bits are written in the last column, the quantity of rows of the interleaving matrix is equal to $B_C$. From another perspective, $B_1+B_2+\ldots+B_C=L$. $B_1, B_2, \ldots,$ and $B_C$ are positive integers.

In the manner 5, a method for determining the quantity of columns of the interleaving matrix is as follows:

If a length of a sequence written into the interleaving matrix is the length M after rate matching, the quantity of columns satisfies that $$R = \min_C \left( \sum_{i=1}^{C} B_i \geq M \right);$$

or if a length of a sequence written into the interleaving matrix is the length N before rate matching, the quantity of columns satisfies that $$R = \min_C \left( \sum_{i=1}^{C} B_i \geq N \right).$$

In this embodiment, the quantity of bits written into each column is different, and the quantity of bits written into each column of the interleaving matrix may be obtained from an odd sequence, an even sequence, or a prime sequence.

After the L number of bits included in the first bit sequence are written into the interleaving matrix according to the write rule described in the manner 5, bits written into at least one row of the interleaving matrix are discontinuous in the first bit sequence, and at least two columns of the interleaving matrix have different quantities of written bits.

Manner 6

The L number of bits are written into the interleaving matrix in n rounds, writing is performed into at least one column of the interleaving matrix in each round, and a quantity of bits written into each column in each round is different.

Figure 15:
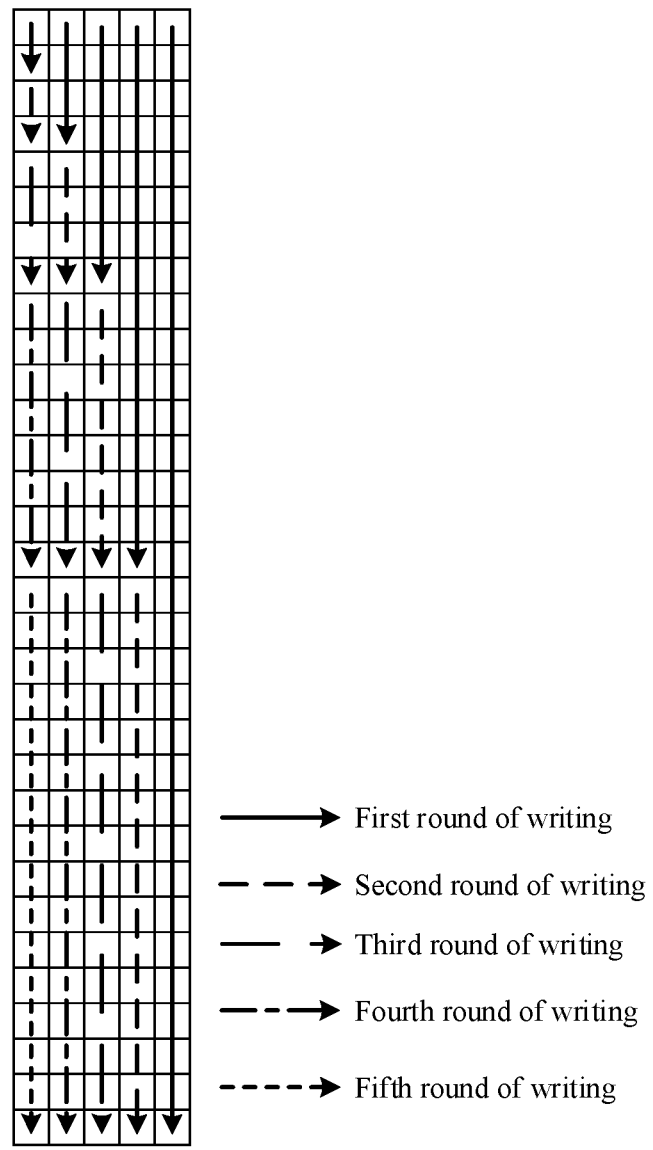
FIG. 15 shows yet another example of a write rule.

FIG. 15 shows yet another example of the write rule. As shown in FIG. 15, writing is performed into five columns of the interleaving matrix in the first round, and quantities of bits written into the first column to the fifth column are respectively 2, 4, 8, 16, and 32. Writing is performed into the first column to the fourth column of the interleaving matrix in the second round, and quantities of bits written into the first column to the fourth column are respectively 2, 4, 8, 16. Writing is performed into the first column to the third column of the interleaving matrix in the third round, and quantities of bits written into the first column to the third column are respectively 4, 8, and 16. Writing is performed into the first column and the second column of the interleaving matrix in the fourth round, and quantities of bits written into the first column and the second column are respectively 8 and 16. Writing is performed into the first column of the interleaving matrix in the fifth round, and a quantity of written bits is 16.

In this embodiment, a maximum quantity of bits that can be written into one column satisfies that $B_{max}=2^{\lceil \log_2 M \rceil - 1}$, and the total quantity of columns of the interleaving matrix satisfies that $R=\log_2 B_{max}$.

A method for determining the quantity C of rows of the interleaving matrix is:

If a length of a sequence written into the interleaving matrix is the length M after rate matching, $C=\max(B_{max}, \lceil M/R \rceil)$.

If a length of a sequence written into the interleaving matrix is the length N before rate matching, $C=\max(B_{max}, \lceil M/R \rceil)$.

After the L number of bits included in the first bit sequence are written into the interleaving matrix according to the write rule described in the manner 6, bits written into at least one row of the interleaving matrix are discontinuous in the first bit sequence, and bits written into at least one column of the interleaving matrix are discontinuous in the first bit sequence either.

Manner 7

The L number of bits are written into the interleaving matrix column by column, at least two columns have different quantities of written bits, and a quantity of bits written into each column is an exponential power of 2.

Figure 16:
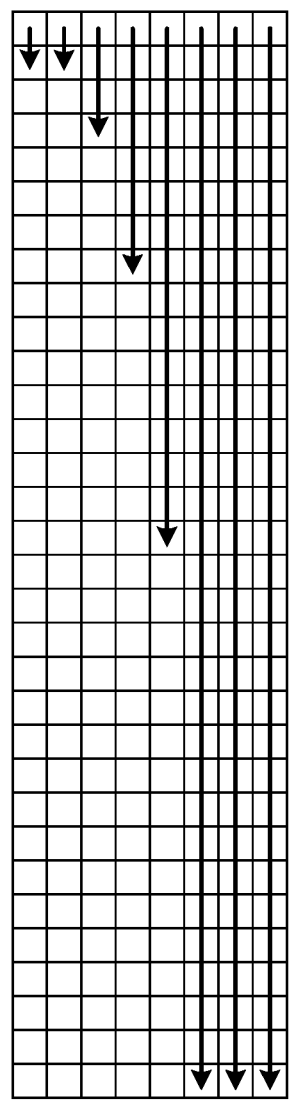
FIG. 16 shows yet another example of a write rule.

FIG. 16 shows yet another example of the write rule. For example, L=128, and quantities of bits written into the first column to the fifth column are respectively 2, 2, 4, 8, 16, 32, and 32.

In this embodiment, the total quantity of rows of the interleaving matrix is equal to a quantity of bits written into a column that has a largest quantity of written bits. For details, refer to the description of determining the quantity of rows of the interleaving matrix in the manner 5.

A method for determining the quantity of columns is as follows:

If a length of a written sequence is the length M after rate matching, the quantity of columns satisfies that R=⌈log$_2$(M)⌉+1. If a length of a written sequence is the length N before rate matching, the quantity of columns satisfies that R=⌈log$_2$(N)⌉+1.

After the L number of bits included in the first bit sequence are written into the interleaving matrix according to the write rule described in the manner 7, bits written into at least one row of the interleaving matrix are discontinuous in the first bit sequence, and at least two columns of the interleaving matrix have different quantities of written bits.

Manner 8

The L number of bits are written into the interleaving matrix column by column, a quantity of bits written into each column is not completely equal, and a quantity of bits written into each column of the interleaving matrix may be an odd sequence or a prime sequence.

In this embodiment, the total quantity of rows of the interleaving matrix is equal to a quantity C of constellation points, and a method for determining the quantity R of columns is as follows:

If a length of a written sequence is the length M after rate matching, the quantity of columns satisfies that $$R = \sum_{i=1}^{R} B_i = M.$$

If a length of a written sequence is the length N before rate matching, the quantity of columns satisfies that $$R = \sum_{i=1}^{R} B_i = N.$$

After the L number of bits included in the first bit sequence are written into the interleaving matrix according to the write rule described in the manner 8, bits written into at least one row of the interleaving matrix are discontinuous in the first bit sequence, and at least two columns of the interleaving matrix have different quantities of written bits.

Manner 9

When the L number of bits are written into the interleaving matrix, write directions of any two rounds of writing may be the same or may be different.

When writing is performed by column, writing performed into one column of an interleaving unit each time is considered as one round of writing. When writing is performed by row, writing performed into one row of an interleaving unit each time is considered as one round of writing.

Figure 17:
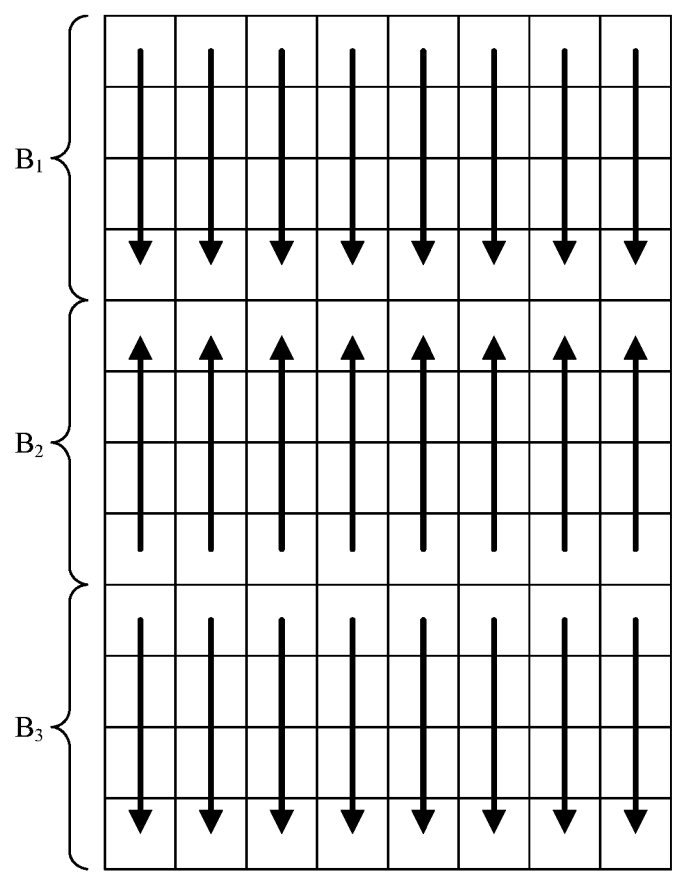
FIG. 17 is a schematic diagram of a write direction.

FIG. 17 is a schematic diagram of a write direction. In FIG. 17, interleaving units corresponding to $B_1$, $B_2$, and $B_3$ each occupy four rows and eight columns of the interleaving matrix. When the L number of bits are written into the interleaving matrix, a write direction for each column of the interleaving unit corresponding to $B_1$ is from top to bottom, a write direction for each column of the interleaving unit corresponding to $B_2$ is from bottom to top, and a write direction for each column of the interleaving unit corresponding to $B_3$ is from top to bottom. $B_1$, $B_2$, and $B_3$ are positive integers.

The write direction shown in FIG. 17 is merely used as an example. It may be understood that in the various write rules described above, write directions in any two rounds of writing may be the same or different.

In the description in the manner 9, regardless of whether the L number of bits of the first bit sequence are written into the interleaving matrix by row or by column, write directions in any two rounds of writing may be the same or different. Correlation between a bit sequence before interleaving and a bit sequence after interleaving is further reduced in this manner, and interleaving performance can be improved.

Manner 10

The L number of bits are written into Z interleaving units for separate interleaving, and outputs of the Z interleaving units are combined to obtain the second bit sequence.

To-be-interleaved bits are divided into Z segments, and the Z segments of bits respectively enter Z interleaving units with different interleaving depths for interleaving. Then, outputs of the interleaving units are combined to obtain an interleaved sequence (that is, the second bit sequence).

Combination methods include a parallel-in serial-out (Parallel-In, Serial-Out, PISO) shift register, cascade data odd-even interleaving, cascade data bit reversal interleaving, and the like. Common interleaving depths include 5, 7, 9, 11, and the like.

An interleaving process of the manner 10 is described by using Z=2 as an example. In the following, the two interleaving units having different interleaving depths are denoted as a first interleaving unit and a second interleaving unit, the interleaving depths are denoted as $B_1$ and $B_2$, and lengths of the two segments of bits are denoted as $M_1$ and $M_2$. $B_1$, $B_2$, $M_1$, and $M_2$ are positive integers.

$M_1 = \lceil M/2 \rceil$ and $M_2 = M - M_1$; or $M_1 = \lceil M/2 \rceil + 1$ and $M_2 = M - M_1$. A quantity of rows of the first interleaving unit satisfies that $C_1 = \lceil M_1/B_1 \rceil$, and a quantity of rows of the second interleaving unit satisfies that $C_2 = \lceil M_2/B_2 \rceil$.

The depths $B_1$ and $B_2$ of the two interleavers may be respectively 5 and 11, 5 and 7, or 7 and 11.

In some embodiments, the interleaving process may be expressed as follows:

To-be-interleaved bits [1, 2, 3, 4, ..., M] are divided into two groups, the first group is [1, 2, 3, 4, ..., $M_1$], and the second group is [$M_1$+1, $M_1$+2, ..., $M_2$]. The first group of to-be-interleaved bits are written into the first interleaving unit row by row, and NULL is written at a position without a bit. The second group of to-be-interleaved bits are written into the second interleaving unit row by row, and NULL is written at a position without a bit.

Bits are read from the two interleaving units column by column, and then two groups of read bits are combined. NULL is skipped in a reading process. A combination manner may be:

(1) splicing the two groups of bits into a bit sequence whose length is M, and then finishing rearrangement and combination by performing bit reversal on numbers; or (2) alternately outputting one bit each time from the two interleaving units until output of the two interleaving units are both completed; or (3) finishing combination directly through PISO parallel-to-serial conversion.

The L number of bits included in the first bit sequence are written into the interleaving matrix according to the write rule described in the manner 10, and bits written into at least one row and at least one column of the interleaving matrix are discontinuous in the first bit sequence.

Manner 11

The L number of bits are divided into n segments, and the n segments of bits are respectively written into n interleaving units. Then, the n interleaving units are spliced in a column direction, and finally, a plurality of rectangular spliced blocks that are spliced in the column direction are read. Interleaving depths of the n interleaving units are different from each other.

This embodiment is described by using n=2 as an example. That is, to-be-interleaved bits are separately written into two interleaving units for interleaving. In the following, the two interleaving units having different interleaving depths are denoted as a first interleaving unit and a second interleaving unit.

An interleaving process may be expressed as follows:

The to-be-interleaved bits are divided into two segments, the two segments of bits are respectively written into the first interleaving unit and the second interleaving unit row by row, and NULL is written into a part that is not fully filled in each interleaving unit.

Lengths of the two segments of bits may be respectively: $M_1=\lceil M/2 \rceil$ and $M_2=M-M_1$; or $M_1=\lceil M/2 \rceil+1$ and $M_2=M-M_1$. A quantity of rows of the first interleaving unit satisfies that $C_1=\lceil M_1/B_1 \rceil$, and a quantity of rows of the second interleaving unit satisfies that $C_2=\lceil M_2/B_2 \rceil$.

The two interleaving units are spliced in a column direction.

Figure 18:
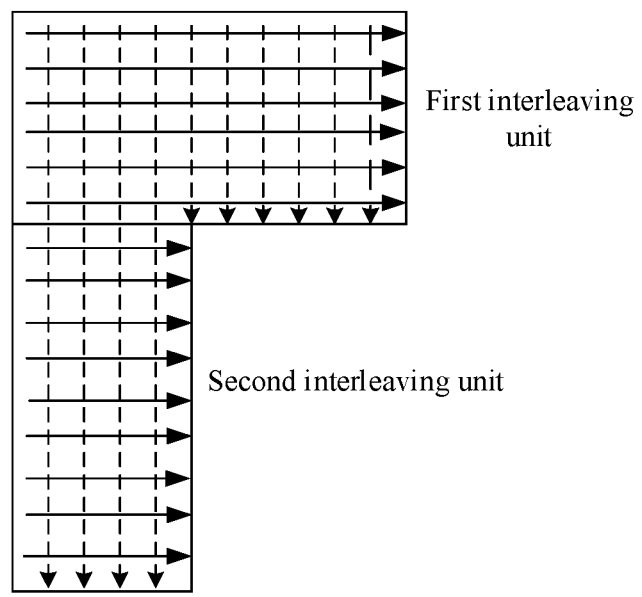
FIG. 18 is a schematic diagram of splicing of interleaving units having two interleaving depths.

For a splicing process in this embodiment, refer to FIG. 18. FIG. 18 is a schematic diagram of splicing of interleaving units having two interleaving depths. In FIG. 18, solid lines represent performing writing row by row, and dashed lines represent performing reading column by column.

The first bit sequence is written, according to the write rule described in the manner 11, into spliced blocks of a plurality of interleaving units having different interleaving depths. Bits written into at least one column of the spliced blocks are discontinuous in the first bit sequence.

In some embodiments, row transformation, such as bit reversal exchange or odd-even exchange, may be performed on the interleaving matrix before reading. NULL is skipped during reading.

It may be understood that because sizes of the rectangular spliced blocks are different from each other, row transformation may be performed only on a min(R1, R2, . . . , Rn) column.

In the foregoing embodiments, how to write the to-be-interleaved bit sequence (that is, the first bit sequence) into the interleaving matrix is described in detail. The following describes the read rule in this embodiment. The following read rule is applicable to reading in any embodiment in which writing is performed into the interleaving matrix according to the write rule.

In this embodiment, there are a plurality of read rules. For example:

(1) Reading is performed from left to right row by row.
(2) Reading is performed from right to left row by row.
(3) Reading is performed from left to right in an odd row, and reading is performed from right to left in an even row.
(4) Each row has a same read direction and a different read start point. In this case, the read start point of each row may be determined based on a read function, or may be determined by a cyclic shift register.

In addition, for some write rules, for clear description of the solutions, read rules applicable to the solutions are described after the respective write rules, for example, the manner 3, the manner 4, the manner 10, and the manner 11. In other words, in addition to the common read rules described herein, the manner 3, the manner 4, the manner 10, and the manner 11 may be applicable to read rules designed for respective write rules, to improve interleaving performance.

It should be noted that in a reading process, if a length of a bit sequence written into the interleaving matrix is the length N before rate matching, a position with NULL, a punctured (punctured) position, or a shortened (shorten) position needs to be skipped. If a length of a bit sequence written into the interleaving matrix is the length M after rate matching, a position with NULL needs to be skipped. This is applicable to any writing above.

In some embodiments, in this embodiment, after the L number of bits are written into the interleaving matrix, column exchange may be further performed on the interleaving matrix. Manners of column exchange may include odd-even exchange, bit reversal, fixed column transformation, column transformation that is performed based on a predefined transform function, and the like.

For example, an original order of column numbers is [1 2 3 4 5 6 7 8], a result of odd-even exchange is [2 1 4 3 6 5 8 7], and a result of bit reversal is [1 5 3 7 2 6 4 8].

In any one of the foregoing writing manners, column transformation may be performed after writing is finished, and then reading is performed.

The following provides an interleaved sequence obtained by performing interleaving according to the method in the embodiments of this application. The interleaved sequence obtained by using the manners in the foregoing embodiments is not limited to sequences listed below.

It should be understood that the interleaved sequence described herein is the second bit sequence obtained by reading, according to the read rule, the L number of bits written into the interleaving matrix.

When 64QAM is used, for a polar code construction sequence whose code length is 1024, an interleaved sequence of the polar code construction sequence may be a sequence #1 shown below:

A polarized channel index (or referred to as a polarized channel number) in the sequence #1 starts from 0. If the polarized channel index starts from 1, a sequence number may be obtained by adding 1 to the entire sequence #1.

Sequence #1

[1023, 1007, 991, 975, 959, 943, 927, 911, 895, 879, 863, 847, 831, 815, 799, 783, 767, 751, 735, 719, 703, 687, 671, 655, 639, 623, 607, 591, 575, 559, 543, 527, 1015, 999, 983, 967, 951, 935, 919, 903, 887, 871, 855, 839, 823, 807, 791, 775, 759, 743, 727, 711, 695, 679, 663, 647, 631, 615, 599, 583, 567, 551, 535, 519, 1019, 1003, 987, 971, 955, 939, 923, 907, 891, 875, 859, 843, 827, 811, 795, 779, 763, 747, 731, 715, 699, 683, 667, 651, 635, 619, 603, 587, 571, 555, 539, 523, 1011, 995, 979, 963, 947, 931, 915, 899, 883, 867, 851, 835, 819, 803, 787, 771, 755, 739, 723, 707, 691, 675, 659, 643, 627, 611, 595, 579, 563, 547, 531, 515, 1021, 1005, 989, 973, 957, 941, 925, 909, 893, 877, 861, 845, 829, 813, 797, 781, 765, 749, 733, 717, 701, 685, 669, 653, 637, 621, 605, 589, 573, 557, 541, 525, 1013, 997, 981, 965, 949, 933, 917, 901, 885, 869, 853, 837, 821, 805, 789, 773, 757, 741, 725, 709, 693, 677, 661, 645, 629, 613, 597, 581, 565, 549, 533, 517, 1017, 1001, 985, 969, 953, 937, 921, 905, 889, 873, 857, 841, 825, 809, 793, 777, 761, 745, 729, 713, 697, 681, 665, 649, 633, 617, 601, 585, 569, 553, 537, 521, 1009, 993, 977, 961, 945, 929, 913, 897, 881, 865, 849, 833, 817, 801, 785, 769, 753, 737, 721, 705, 689, 673, 657, 641, 625, 609, 593, 577, 561, 545, 529, 513, 1022, 1006, 990, 974, 958, 942, 926, 910, 894, 878, 862, 846, 830, 814, 798, 782, 766, 750, 734, 718, 702, 686, 670, 654, 638, 622, 606, 590, 574, 558, 542, 526, 1014, 998, 982, 966, 950, 934, 918, 902, 886, 870, 854, 838, 822, 806, 790, 774, 758, 742, 726, 710, 694, 678, 662, 646, 630, 614, 598, 582, 566, 550, 534, 518, 1018, 1002, 986, 970, 954, 938, 922, 906, 890, 874, 858, 842, 826, 810, 794, 778, 762, 746, 730, 714, 698, 682, 666, 650, 634, 618, 602, 586, 570, 554, 538, 522, 1010, 994, 978, 962, 946, 930, 914, 898, 882, 866, 850, 834, 818, 802, 786, 770, 754, 738, 722, 706, 690, 674, 658, 642, 626, 610, 594, 578, 562, 546, 530, 514, 1020, 1004, 988, 972, 956, 940, 924, 908, 892, 876, 860, 844, 828, 812, 796, 780, 764, 748, 732, 716, 700, 684, 668, 652, 636, 620, 604, 588, 572, 556, 540, 524, 1012, 996, 980, 964, 948, 932, 916, 900, 884, 868, 852, 836, 820, 804, 788, 772, 756, 740, 724, 708, 692, 676, 660, 644, 628, 612, 596, 580, 564, 548, 532, 516, 1016, 1000, 984, 968, 952, 936, 920, 904, 888, 872, 856, 840, 824, 808, 792, 776, 760, 744, 728, 712, 696, 680, 664, 648, 632, 616, 600, 584, 568, 552, 536, 520, 1008, 992, 976, 960, 944, 928, 912, 896, 880, 864, 848, 832, 816, 800, 784, 768, 752, 736, 720, 704, 688, 672, 656, 640, 624, 608, 592, 576, 560, 544, 528, 512, 511, 495, 479, 463, 447, 431, 415, 399, 383, 367, 351, 335, 319, 303, 287, 271, 255, 239, 223, 207, 191, 175, 159, 143, 127, 111, 95, 79, 63, 47, 31, 15, 503, 487, 471, 455, 439, 423, 407, 391, 375, 359, 343, 327, 311, 295, 279, 263, 247, 231, 215, 199, 183, 167, 151, 135, 119, 103, 87, 71, 55, 39, 23, 7, 507, 491, 475, 459, 443, 427, 411, 395, 379, 363, 347, 331, 315, 299, 283, 267, 251, 235, 219, 203, 187, 171, 155, 139, 123, 107, 91, 75, 59, 43, 27, 11, 499, 483, 467, 451, 435, 419, 403, 387, 371, 355, 339, 323, 307, 291, 275, 259, 243, 227, 211, 195, 179, 163, 147, 131, 115, 99, 83, 67, 51, 35, 19, 3, 509, 493, 477, 461, 445, 429, 413, 397, 381, 365, 349, 333, 317, 301, 285, 269, 253, 237, 221, 205, 189, 173, 157, 141, 125, 109, 93, 77, 61, 45, 29, 13, 501, 485, 469, 453, 437, 421, 405, 389, 373, 357, 341, 325, 309, 293, 277, 261, 245, 229, 213, 197, 181, 165, 149, 133, 117, 101, 85, 69, 53, 37, 21, 5, 505, 489, 473, 457, 441, 425, 409, 393, 377, 361, 345, 329, 313, 297, 281, 265, 249, 233, 217, 201, 185, 169, 153, 137, 121, 105, 89, 73, 57, 41, 25, 9, 497, 481, 465, 449, 433, 417, 401, 385, 369, 353, 337, 321, 305, 289, 273, 257, 241, 225, 209, 193, 177, 161, 145, 129, 113, 97, 81, 65, 49, 33, 17, 1, 510, 494, 478, 462, 446, 430, 414, 398, 382, 366, 350, 334, 318, 302, 286, 270, 254, 238, 222, 206, 190, 174, 158, 142, 126, 110, 94, 78, 62, 46, 30, 14, 502, 486, 470, 454, 438, 422, 406, 390, 374, 358, 342, 326, 310, 294, 278, 262, 246, 230, 214, 198, 182, 166, 150, 134, 118, 102, 86, 70, 54, 38, 22, 6, 506, 490, 474, 458, 442, 426, 410, 394, 378, 362, 346, 330, 314, 298, 282, 266, 250, 234, 218, 202, 186, 170, 154, 138, 122, 106, 90, 74, 58, 42, 26, 10, 498, 482, 466, 450, 434, 418, 402, 386, 370, 354, 338, 322, 306, 290, 274, 258, 242, 226, 210, 194, 178, 162, 146, 130, 114, 98, 82, 66, 50, 34, 18, 2, 508, 492, 476, 460, 444, 428, 412, 396, 380, 364, 348, 332, 316, 300, 284, 268, 252, 236, 220, 204, 188, 172, 156, 140, 124, 108, 92, 76, 60, 44, 28, 12, 500, 484, 468, 452, 436, 420, 404, 388, 372, 356, 340, 324, 308, 292, 276, 260, 244, 228, 212, 196, 180, 164, 148, 132, 116, 100, 84, 68, 52, 36, 20, 4, 504, 488, 472, 456, 440, 424, 408, 392, 376, 360, 344, 328, 312, 296, 280, 264, 248, 232, 216, 200, 184, 168, 152, 136, 120, 104, 88, 72, 56, 40, 24, 8, 496, 480, 464, 448, 432, 416, 400, 384, 368, 352, 336, 320, 304, 288, 272, 256, 240, 224, 208, 192, 176, 160, 144, 128, 112, 96, 80, 64, 48, 32, 16, 0]

The sequence #1 is left-right symmetric, and an interleaved sequence after flipping is the same, for example, a sequence #2 shown below:

Sequence #2

[0, 16, 32, 48, 64, 80, 96, 112, 128, 144, 160, 176, 192, 208, 224, 240, 256, 272, 288, 304, 320, 336, 352, 368, 384, 400, 416, 432, 448, 464, 480, 496, 8, 24, 40, 56, 72, 88, 104, 120, 136, 152, 168, 184, 200, 216, 232, 248, 264, 280, 296, 312, 328, 344, 360, 376, 392, 408, 424, 440, 456, 472, 488, 504, 4, 20, 36, 52, 68, 84, 100, 116, 132, 148, 164, 180, 196, 212, 228, 244, 260, 276, 292, 308, 324, 340, 356, 372, 388, 404, 420, 436, 452, 468, 484, 500, 12, 28, 44, 60, 76, 92, 108, 124, 140, 156, 172, 188, 204, 220, 236, 252, 268, 284, 300, 316, 332, 348, 364, 380, 396, 412, 428, 444, 460, 476, 492, 508, 2, 18, 34, 50, 66, 82, 98, 114, 130, 146, 162, 178, 194, 210, 226, 242, 258, 274, 290, 306, 322, 338, 354, 370, 386, 402, 418, 434, 450, 466, 482, 498, 10, 26, 42, 58, 74, 90, 106, 122, 138, 154, 170, 186, 202, 218, 234, 250, 266, 282, 298, 314, 330, 346, 362, 378, 394, 410, 426, 442, 458, 474, 490, 506, 6, 22, 38, 54, 70, 86, 102, 118, 134, 150, 166, 182, 198, 214, 230, 246, 262, 278, 294, 310, 326, 342, 358, 374, 390, 406, 422, 438, 454, 470, 486, 502, 14, 30, 46, 62, 78, 94, 110, 126, 142, 158, 174, 190, 206, 222, 238, 254, 270, 286, 302, 318, 334, 350, 366, 382, 398, 414, 430, 446, 462, 478, 494, 510, 1, 17, 33, 49, 65, 81, 97, 113, 129, 145, 161, 177, 193, 209, 225, 241, 257, 273, 289, 305, 321, 337, 353, 369, 385, 401, 417, 433, 449, 465, 481, 497, 9, 25, 41, 57, 73, 89, 105, 121, 137, 153, 169, 185, 201, 217, 233, 249, 265, 281, 297, 313, 329, 345, 361, 377, 393, 409, 425, 441, 457, 473, 489, 505, 5, 21, 37, 53, 69, 85, 101, 117, 133, 149, 165, 181, 197, 213, 229, 245, 261, 277, 293, 309, 325, 341, 357, 373, 389, 405, 421, 437, 453, 469, 485, 501, 13, 29, 45, 61, 77, 93, 109, 125, 141, 157, 173, 189, 205, 221, 237, 253, 269, 285, 301, 317, 333, 349, 365, 381, 397, 413, 429, 445, 461, 477, 493, 509, 3, 19, 35, 51, 67, 83, 99, 115, 131, 147, 163, 179, 195, 211, 227, 243, 259, 275, 291, 307, 323, 339, 355, 371, 387, 403, 419, 435, 451, 467, 483, 499, 11, 27, 43, 59, 75, 91, 107, 123, 139, 155, 171, 187, 203, 219, 235, 251, 267, 283, 299, 315, 331, 347, 363, 379, 395, 411, 427, 443, 459, 475, 491, 507, 7, 23, 39, 55, 71, 87, 103, 119, 135, 151, 167, 183, 199, 215, 231, 247, 263, 279, 295, 311, 327, 343, 359, 375, 391, 407, 423, 439, 455, 471, 487, 503, 15, 31, 47, 63, 79, 95, 111, 127, 143, 159, 175, 191, 207, 223, 239, 255, 271, 287, 303, 319, 335, 351, 367, 383, 399, 415, 431, 447, 463, 479, 495, 511, 512, 528, 544, 560, 576, 592, 608, 624, 640, 656, 672, 688, 704, 720, 736, 752, 768, 784, 800, 816, 832, 848, 864, 880, 896, 912, 928, 944, 960, 976, 992, 1008, 520, 536, 552, 568, 584, 600, 616, 632, 648, 664, 680, 696, 712, 728, 744, 760, 776, 792, 808, 824, 840, 856, 872, 888, 904, 920, 936, 952, 968, 984, 1000, 1016, 516, 532, 548, 564, 580, 596, 612, 628, 644, 660, 676, 692, 708, 724, 740, 756, 772, 788, 804, 820, 836, 852, 868, 884, 900, 916, 932, 948, 964, 980, 996, 1012, 524, 540, 556, 572, 588, 604, 620, 636, 652, 668, 684, 700, 716, 732, 748, 764, 780, 796, 812, 828, 844, 860, 876, 892, 908, 924, 940, 956, 972, 988, 1004, 1020, 514, 530, 546, 562, 578, 594, 610, 626, 642, 658, 674, 690, 706, 722, 738, 754, 770, 786, 802, 818, 834, 850, 866, 882, 898, 914, 930, 946, 962, 978, 994, 1010, 522, 538, 554, 570, 586, 602, 618, 634, 650, 666, 682, 698, 714, 730, 746, 762, 778, 794, 810, 826, 842, 858, 874, 890, 906, 922, 938, 954, 970, 986, 1002, 1018, 518, 534, 550, 566, 582, 598, 614, 630, 646, 662, 678, 694, 710, 726, 742, 758, 774, 790, 806, 822, 838, 854, 870, 886, 902, 918, 934, 950, 966, 982, 998, 1014, 526, 542, 558, 574, 590, 606, 622, 638, 654, 670, 686, 702, 718, 734, 750, 766, 782, 798, 814, 830, 846, 862, 878, 894, 910, 926, 942, 958, 974, 990, 1006, 1022, 513, 529, 545, 561, 577, 593, 609, 625, 641, 657, 673, 689, 705, 721, 737, 753, 769, 785, 801, 817, 833, 849, 865, 881, 897, 913, 929, 945, 961, 977, 993, 1009, 521, 537, 553, 569, 585, 601, 617, 633, 649, 665, 681, 697, 713, 729, 745, 761, 777, 793, 809, 825, 841, 857, 873, 889, 905, 921, 937, 953, 969, 985, 1001, 1017, 517, 533, 549, 565, 581, 597, 613, 629, 645, 661, 677, 693, 709, 725, 741, 757, 773, 789, 805, 821, 837, 853, 869, 885, 901, 917, 933, 949, 965, 981, 997, 1013, 525, 541, 557, 573, 589, 605, 621, 637, 653, 669, 685, 701, 717, 733, 749, 765, 781, 797, 813, 829, 845, 861, 877, 893, 909, 925, 941, 957, 973, 989, 1005, 1021, 515, 531, 547, 563, 579, 595, 611, 627, 643, 659, 675, 691, 707, 723, 739, 755, 771, 787, 803, 819, 835, 851, 867, 883, 899, 915, 931, 947, 963, 979, 995, 1011, 523, 539, 555, 571, 587, 603, 619, 635, 651, 667, 683, 699, 715, 731, 747, 763, 779, 795, 811, 827, 843, 859, 875, 891, 907, 923, 939, 955, 971, 987, 1003, 1019, 519, 535, 551, 567, 583, 599, 615, 631, 647, 663, 679, 695, 711, 727, 743, 759, 775, 791, 807, 823, 839, 855, 871, 887, 903, 919, 935, 951, 967, 983, 999, 1015, 527, 543, 559, 575, 591, 607, 623, 639, 655, 671, 687, 703, 719, 735, 751, 767, 783, 799, 815, 831, 847, 863, 879, 895, 911, 927, 943, 959, 975, 991, 1007, 1023]

For an interleaved sequence of a polar code construction sequence having any mother code length, an index whose polarized channel number is less than (less than or equal to when the polarized channel index starts from 1) a required length may be directly read from the sequence #1 or the sequence #2.

For example, an interleaved sequence of a construction sequence whose mother code length is N=512 is shown in the following sequence #3:

Sequence #3

[511, 495, 479, 463, 447, 431, 415, 399, 383, 367, 351, 335, 319, 303, 287, 271, 255, 239, 223, 207, 191, 175, 159, 143, 127, 111, 95, 79, 63, 47, 31, 15, 503, 487, 471, 455, 439, 423, 407, 391, 375, 359, 343, 327, 311, 295, 279, 263, 247, 231, 215, 199, 183, 167, 151, 135, 119, 103, 87, 71, 55, 39, 23, 7, 507, 491, 475, 459, 443, 427, 411, 395, 379, 363, 347, 331, 315, 299, 283, 267, 251, 235, 219, 203, 187, 171, 155, 139, 123, 107, 91, 75, 59, 43, 27, 11, 499, 483, 467, 451, 435, 419, 403, 387, 371, 355, 339, 323, 307, 291, 275, 259, 243, 227, 211, 195, 179, 163, 147, 131, 115, 99, 83, 67, 51, 35, 19, 3, 509, 493, 477, 461, 445, 429, 413, 397, 381, 365, 349, 333, 317, 301, 285, 269, 253, 237, 221, 205, 189, 173, 157, 141, 125, 109, 93, 77, 61, 45, 29, 13, 501, 485, 469, 453, 437, 421, 405, 389, 373, 357, 341, 325, 309, 293, 277, 261, 245, 229, 213, 197, 181, 165, 149, 133, 117, 101, 85, 69, 53, 37, 21, 5, 505, 489, 473, 457, 441, 425, 409, 393, 377, 361, 345, 329, 313, 297, 281, 265, 249, 233, 217, 201, 185, 169, 153, 137, 121, 105, 89, 73, 57, 41, 25, 9, 497, 481, 465, 449, 433, 417, 401, 385, 369, 353, 337, 321, 305, 289, 273, 257, 241, 225, 209, 193, 177, 161, 145, 129, 113, 97, 81, 65, 49, 33, 17, 1, 510, 494, 478, 462, 446, 430, 414, 398, 382, 366, 350, 334, 318, 302, 286, 270, 254, 238, 222, 206, 190, 174, 158, 142, 126, 110, 94, 78, 62, 46, 30, 14, 502, 486, 470, 454, 438, 422, 406, 390, 374, 358, 342, 326, 310, 294, 278, 262, 246, 230, 214, 198, 182, 166, 150, 134, 118, 102, 86, 70, 54, 38, 22, 6, 506, 490, 474, 458, 442, 426, 410, 394, 378, 362, 346, 330, 314, 298, 282, 266, 250, 234, 218, 202, 186, 170, 154, 138, 122, 106, 90, 74, 58, 42, 26, 10, 498, 482, 466, 450, 434, 418, 402, 386, 370, 354, 338, 322, 306, 290, 274, 258, 242, 226, 210, 194, 178, 162, 146, 130, 114, 98, 82, 66, 50, 34, 18, 2, 508, 492, 476, 460, 444, 428, 412, 396, 380, 364, 348, 332, 316, 300, 284, 268, 252, 236, 220, 204, 188, 172, 156, 140, 124, 108, 92, 76, 60, 44, 28, 12, 500, 484, 468, 452, 436, 420, 404, 388, 372, 356, 340, 324, 308, 292, 276, 260, 244, 228, 212, 196, 180, 164, 148, 132, 116, 100, 84, 68, 52, 36, 20, 4, 504, 488, 472, 456, 440, 424, 408, 392, 376, 360, 344, 328, 312, 296, 280, 264, 248, 232, 216, 200, 184, 168, 152, 136, 120, 104, 88, 72, 56, 40, 24, 8, 496, 480, 464, 448, 432, 416, 400, 384, 368, 352, 336, 320, 304, 288, 272, 256, 240, 224, 208, 192, 176, 160, 144, 128, 112, 96, 80, 64, 48, 32, 16, 0]

An interleaved sequence having another mother code length may be obtained by using the same method, and details are not described one by one herein again.

After the interleaved sequence is obtained, when a coding length is not equal to the mother code length, a number of a polarized channel that needs to be punctured or shortened is removed from the interleaved sequence.

When 16QAM is used, for a polar code construction sequence whose code length is 1024, an interleaved sequence of the polar code construction sequence may be a sequence #4 shown below:

Sequence #4

[1023, 959, 895, 831, 767, 703, 639, 575, 991, 927, 863, 799, 735, 671, 607, 543, 1007, 943, 879, 815, 751, 687, 623, 559, 975, 911, 847, 783, 719, 655, 591, 527, 1015, 951, 887, 823, 759, 695, 631, 567, 983, 919, 855, 791, 727, 663, 599, 535, 999, 935, 871, 807, 743, 679, 615, 551, 967, 903, 839, 775, 711, 647, 583, 519, 1019, 955, 891, 827, 763, 699, 635, 571, 987, 923, 859, 795, 731, 667, 603, 539, 1003, 939, 875, 811, 747, 683, 619, 555, 971, 907, 843, 779, 715, 651, 587, 523, 1011, 947, 883, 819, 755, 691, 627, 563, 979, 915, 851, 787, 723, 659, 595, 531, 995, 931, 867, 803, 739, 675, 611, 547, 963, 899, 835, 771, 707, 643, 579, 515, 1021, 957, 893, 829, 765, 701, 637, 573, 989, 925, 861, 797, 733, 669, 605, 541, 1005, 941, 877, 813, 749, 685, 621, 557, 973, 909, 845, 781, 717, 653, 589, 525, 1013, 949, 885, 821, 757, 693, 629, 565, 981, 917, 853, 789, 725, 661, 597, 533, 997, 933, 869, 805, 741, 677, 613, 549, 965, 901, 837, 773, 709, 645, 581, 517, 1017, 953, 889, 825, 761, 697, 633, 569, 985, 921, 857, 793, 729, 665, 601, 537, 1001, 937, 873, 809, 745, 681, 617, 553, 969, 905, 841, 777, 713, 649, 585, 521, 1009, 945, 881, 817, 753, 689, 625, 561, 977, 913, 849, 785, 721, 657, 593, 529, 993, 929, 865, 801, 737, 673, 609, 545, 961, 897, 833, 769, 705, 641, 577, 513, 1022, 958, 894, 830, 766, 702, 638, 574, 990, 926, 862, 798, 734, 670, 606, 542, 1006, 942, 878, 814, 750, 686, 622, 558, 974, 910, 846, 782, 718, 654, 590, 526, 1014, 950, 886, 822, 758, 694, 630, 566, 982, 918, 854, 790, 726, 662, 598, 534, 998, 934, 870, 806, 742, 678, 614, 550, 966, 902, 838, 774, 710, 646, 582, 518, 1018, 954, 890, 826, 762, 698, 634, 570, 986, 922, 858, 794, 730, 666, 602, 538, 1002, 938, 874, 810, 746, 682, 618, 554, 970, 906, 842, 778, 714, 650, 586, 522, 1010, 946, 882, 818, 754, 690, 626, 562, 978, 914, 850, 786, 722, 658, 594, 530, 994, 930, 866, 802, 738, 674, 610, 546, 962, 898, 834, 770, 706, 642, 578, 514, 1020, 956, 892, 828, 764, 700, 636, 572, 988, 924, 860, 796, 732, 668, 604, 540, 1004, 940, 876, 812, 748, 684, 620, 556, 972, 908, 844, 780, 716, 652, 588, 524, 1012, 948, 884, 820, 756, 692, 628, 564, 980, 916, 852, 788, 724, 660, 596, 532, 996, 932, 868, 804, 740, 676, 612, 548, 964, 900, 836, 772, 708, 644, 580, 516, 1016, 952, 888, 824, 760, 696, 632, 568, 984, 920, 856, 792, 728, 664, 600, 536, 1000, 936, 872, 808, 744, 680, 616, 552, 968, 904, 840, 776, 712, 648, 584, 520, 1008, 944, 880, 816, 752, 688, 624, 560, 976, 912, 848, 784, 720, 656, 592, 528, 992, 928, 864, 800, 736, 672, 608, 544, 960, 896, 832, 768, 704, 640, 576, 512, 511, 447, 383, 319, 255, 191, 127, 63, 479, 415, 351, 287, 223, 159, 95, 31, 495, 431, 367, 303, 239, 175, 111, 47, 463, 399, 335, 271, 207, 143, 79, 15, 503, 439, 375, 311, 247, 183, 119, 55, 471, 407, 343, 279, 215, 151, 87, 23, 487, 423, 359, 295, 231, 167, 103, 39, 455, 391, 327, 263, 199, 135, 71, 7, 507, 443, 379, 315, 251, 187, 123, 59, 475, 411, 347, 283, 219, 155, 91, 27, 491, 427, 363, 299, 235, 171, 107, 43, 459, 395, 331, 267, 203, 139, 75, 11, 499, 435, 371, 307, 243, 179, 115, 51, 467, 403, 339, 275, 211, 147, 83, 19, 483, 419, 355, 291, 227, 163, 99, 35, 451, 387, 323, 259, 195, 131, 67, 3, 509, 445, 381, 317, 253, 189, 125, 61, 477, 413, 349, 285, 221, 157, 93, 29, 493, 429, 365, 301, 237, 173, 109, 45, 461, 397, 333, 269, 205, 141, 77, 13, 501, 437, 373, 309, 245, 181, 117, 53, 469, 405, 341, 277, 213, 149, 85, 21, 485, 421, 357, 293, 229, 165, 101, 37, 453, 389, 325, 261, 197, 133, 69, 5, 505, 441, 377, 313, 249, 185, 121, 57, 473, 409, 345, 281, 217, 153, 89, 25, 489, 425, 361, 297, 233, 169, 105, 41, 457, 393, 329, 265, 201, 137, 73, 9, 497, 433, 369, 305, 241, 177, 113, 49, 465, 401, 337, 273, 209, 145, 81, 17, 481, 417, 353, 289, 225, 161, 97, 33, 449, 385, 321, 257, 193, 129, 65, 1, 510, 446, 382, 318, 254, 190, 126, 62, 478, 414, 350, 286, 222, 158, 94, 30, 494, 430, 366, 302, 238, 174, 110, 46, 462, 398, 334, 270, 206, 142, 78, 14, 502, 438, 374, 310, 246, 182, 118, 54, 470, 406, 342, 278, 214, 150, 86, 22, 486, 422, 358, 294, 230, 166, 102, 38, 454, 390, 326, 262, 198, 134, 70, 6, 506, 442, 378, 314, 250, 186, 122, 58, 474, 410, 346, 282, 218, 154, 90, 26, 490, 426, 362, 298, 234, 170, 106, 42, 458, 394, 330, 266, 202, 138, 74, 10, 498, 434, 370, 306, 242, 178, 114, 50, 466, 402, 338, 274, 210, 146, 82, 18, 482, 418, 354, 290, 226, 162, 98, 34, 450, 386, 322, 258, 194, 130, 66, 2, 508, 444, 380, 316, 252, 188, 124, 60, 476, 412, 348, 284, 220, 156, 92, 28, 492, 428, 364, 300, 236, 172, 108, 44, 460, 396, 332, 268, 204, 140, 76, 12, 500, 436, 372, 308, 244, 180, 116, 52, 468, 404, 340, 276, 212, 148, 84, 20, 484, 420, 356, 292, 228, 164, 100, 36, 452, 388, 324, 260, 196, 132, 68, 4, 504, 440, 376, 312, 248, 184, 120, 56, 472, 408, 344, 280, 216, 152, 88, 24, 488, 424, 360, 296, 232, 168, 104, 40, 456, 392, 328, 264, 200, 136, 72, 8, 496, 432, 368, 304, 240, 176, 112, 48, 464, 400, 336, 272, 208, 144, 80, 16, 480, 416, 352, 288, 224, 160, 96, 32, 448, 384, 320, 256, 192, 128, 64, 0]

Similar to that when 64QAM is used, an interleaved sequence of a construction sequence having any mother code length may be read from the length sequence #4. Details are not described one by one herein.

The following provides a possible interleaved sequence of a construction sequence whose length is N=1024, as shown in the following sequence #5:

Sequence #5

[1022, 1019, 1016, 1013, 1010, 1007, 1004, 1001, 998, 995, 992, 989, 986, 983, 980, 977, 974, 971, 968, 965, 962, 959, 956, 953, 950, 947, 944, 941, 938, 935, 932, 929, 926, 923, 920, 917, 914, 911, 908, 905, 902, 899, 896, 893, 890, 887, 884, 881, 878, 875, 872, 869, 866, 863, 860, 857, 854, 851, 848, 845, 842, 839, 836, 833, 830, 827, 824, 821, 818, 815, 812, 809, 806, 803, 800, 797, 794, 791, 788, 785, 782, 779, 776, 773, 770, 767, 764, 761, 758, 755, 752, 749, 746, 743, 740, 737, 734, 731, 728, 725, 722, 719, 716, 713, 710, 707, 704, 701, 698, 695, 692, 689, 686, 683, 680, 677, 674, 671, 668, 665, 662, 659, 656, 653, 650, 647, 644, 641, 637, 633, 629, 625, 621, 617, 613, 609, 605, 601, 597, 593, 589, 585, 581, 577, 573, 569, 565, 561, 557, 553, 549, 545, 541, 537, 533, 529, 525, 521, 517, 513, 509, 505, 501, 497, 493, 489, 485, 481, 477, 473, 469, 465, 461, 457, 453, 449, 445, 441, 437, 433, 429, 425, 421, 417, 413, 409, 405, 401, 397, 393, 389, 385, 380, 375, 370, 365, 360, 355, 350, 345, 340, 335, 330, 325, 320, 315, 310, 305, 300, 295, 290, 285, 280, 275, 270, 265, 260, 255, 250, 245, 240, 235, 230, 225, 219, 213, 207, 201, 195, 189, 183, 177, 171, 165, 159, 153, 147, 141, 135, 129, 123, 116, 109, 102, 95, 88, 81, 74, 66, 58, 50, 42, 34, 25, 15, 4, 1023, 1020, 1017, 1014, 1011, 1008, 1005, 1002, 999, 996, 993, 990, 987, 984, 981, 978, 975, 972, 969, 966, 963, 960, 957, 954, 951, 948, 945, 942, 939, 936, 933, 930, 927, 924, 921, 918, 915, 912, 909, 906, 903, 900, 897, 894, 891, 888, 885, 882, 879, 876, 873, 870, 867, 864, 861, 858, 855, 852, 849, 846, 843, 840, 837, 834, 831, 828, 825, 822, 819, 816, 813, 810, 807, 804, 801, 798, 795, 792, 789, 786, 783, 780, 777, 774, 771, 768, 765, 762, 759, 756, 753, 750, 747, 744, 741, 738, 735, 732, 729, 726, 723, 720, 717, 714, 711, 708, 705, 702, 699, 696, 693, 690, 687, 684, 681, 678, 675, 672, 669, 666, 663, 660, 657, 654, 651, 648, 645, 642, 638, 634, 630, 626, 622, 618, 614, 610, 606, 602, 598, 594, 590, 586, 582, 578, 574, 570, 566, 562, 558, 554, 550, 546, 542, 538, 534, 530, 526, 522, 518, 514, 510, 506, 502, 498, 494, 490, 486, 482, 478, 474, 470, 466, 462, 458, 454, 450, 446, 442, 438, 434, 430, 426, 422, 418, 414, 410, 406, 402, 398, 394, 390, 386, 382, 377, 372, 367, 362, 357, 352, 347, 342, 337, 332, 327, 322, 317, 312, 307, 302, 297, 292, 287, 282, 277, 272, 267, 262, 257, 252, 247, 242, 237, 232, 227, 221, 215, 209, 203, 197, 191, 185, 179, 173, 167, 161, 155, 149, 143, 137, 131, 125, 118, 111, 104, 97, 90, 83, 76, 68, 60, 52, 44, 36, 27, 18, 7, 1021, 1018, 1015, 1012, 1009, 1006, 1003, 1000, 997, 994, 991, 988, 985, 982, 979, 976, 973, 970, 967, 964, 961, 958, 955, 952, 949, 946, 943, 940, 937, 934, 931, 928, 925, 922, 919, 916, 913, 910, 907, 904, 901, 898, 895, 892, 889, 886, 883, 880, 877, 874, 871, 868, 865, 862, 859, 856, 853, 850, 847, 844, 841, 838, 835, 832, 829, 826, 823, 820, 817, 814, 811, 808, 805, 802, 799, 796, 793, 790, 787, 784, 781, 778, 775, 772, 769, 766, 763, 760, 757, 754, 751, 748, 745, 742, 739, 736, 733, 730, 727, 724, 721, 718, 715, 712, 709, 706, 703, 700, 697, 694, 691, 688, 685, 682, 679, 676, 673, 670, 667, 664, 661, 658, 655, 652, 649, 646, 643, 640, 636, 632, 628, 624, 620, 616, 612, 608, 604, 600, 596, 592, 588, 584, 580, 576, 572, 568, 564, 560, 556, 552, 548, 544, 540, 536, 532, 528, 524, 520, 516, 512, 508, 504, 500, 496, 492, 488, 484, 480, 476, 472, 468, 464, 460, 456, 452, 448, 444, 440, 436, 432, 428, 424, 420, 416, 412, 408, 404, 400, 396, 392, 388, 384, 379, 374, 369, 364, 359, 354, 349, 344, 339, 334, 329, 324, 319, 314, 309, 304, 299, 294, 289, 284, 279, 274, 269, 264, 259, 254, 249, 244, 239, 234, 229, 224, 218, 212, 206, 200, 194, 188, 182, 176, 170, 164, 158, 152, 146, 140, 134, 128, 121, 114, 107, 100, 93, 86, 79, 72, 64, 56, 48, 40, 31, 22, 12, 1, 639, 635, 631, 627, 623, 619, 615, 611, 607, 603, 599, 595, 591, 587, 583, 579, 575, 571, 567, 563, 559, 555, 551, 547, 543, 539, 535, 531, 527, 523, 519, 515, 511, 507, 503, 499, 495, 491, 487, 483, 479, 475, 471, 467, 463, 459, 455, 451, 447, 443, 439, 435, 431, 427, 423, 419, 415, 411, 407, 403, 399, 395, 391, 387, 383, 378, 373, 368, 363, 358, 353, 348, 343, 338, 333, 328, 323, 318, 313, 308, 303, 298, 293, 288, 283, 278, 273, 268, 263, 258, 253, 248, 243, 238, 233, 228, 223, 217, 211, 205, 199, 193, 187, 181, 175, 169, 163, 157, 151, 145, 139, 133, 127, 120, 113, 106, 99, 92, 85, 78, 71, 63, 55, 47, 39, 30, 21, 10, 381, 376, 371, 366, 361, 356, 351, 346, 341, 336, 331, 326, 321, 316, 311, 306, 301, 296, 291, 286, 281, 276, 271, 266, 261, 256, 251, 246, 241, 236, 231, 226, 220, 214, 208, 202, 196, 190, 184, 178, 172, 166, 160, 154, 148, 142, 136, 130, 124, 117, 110, 103, 96, 89, 82, 75, 67, 59, 51, 43, 35, 26, 16, 5, 222, 216, 210, 204, 198, 192, 186, 180, 174, 168, 162, 156, 150, 144, 138, 132, 126, 119, 112, 105, 98, 91, 84, 77, 69, 61, 53, 45, 37, 28, 19, 8, 122, 115, 108, 101, 94, 87, 80, 73, 65, 57, 49, 41, 32, 23, 13, 2, 70, 62, 54, 46, 38, 29, 20, 9, 33, 24, 14, 3, 17, 6, 11, 0]

Similarly, all interleaved sequences of a mother code sequence less than 1024 may be read from the sequence #5, and details are not described herein again.

In the embodiments of this application, by using the quasi periodicity of the polar code, error correction performance of an interleaved sequence designed based on row-column interleaving is similar to or even higher than that of random interleaving, and the error correction performance of the polar code used for channel coding can be improved without increasing interleaving complexity.

The interleaving method provided in this application is described above in detail with reference to FIG. 1 to FIG. 18. The following describes an interleaving apparatus provided in an embodiment of this application.

Figure 19:
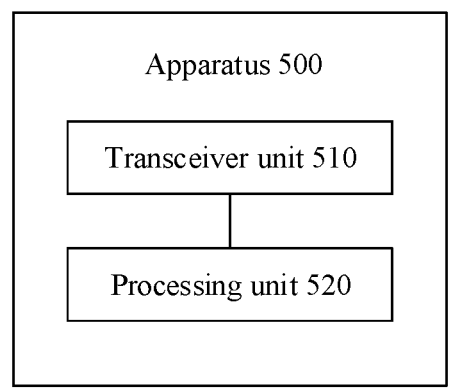
FIG. 19 is a schematic diagram of an interleaving apparatus 500 according to this application.

FIG. 19 is a schematic diagram of an interleaving apparatus 500 according to this application. As shown in FIG. 19, the apparatus 500 includes a transceiver unit 510 and a processing unit 520.

The transceiver unit 510 is configured to obtain a first bit sequence, where the first bit sequence includes L number of bits, and L is a positive integer.

The processing unit 520 is configured to write the L number of bits into an interleaving matrix according to a preset write rule, where the interleaving matrix includes C rows and R number of columns, and C and R are positive integers.

The processing unit 520 is further configured to read the L number of bits from the interleaving matrix according to a preset read rule, to obtain a second bit sequence.

The transceiver unit 510 is further configured to send the second bit sequence.

The foregoing and other operations or functions of the units in the apparatus 500 in this embodiment are separately used to implement the interleaving method in various embodiments described herein. For brevity, details are not repeated.

According to the interleaving apparatus in this embodiment, by using quasi periodicity of a polar code, error correction performance of the polar code used for channel coding can be improved without increasing interleaving complexity.

Figure 20:
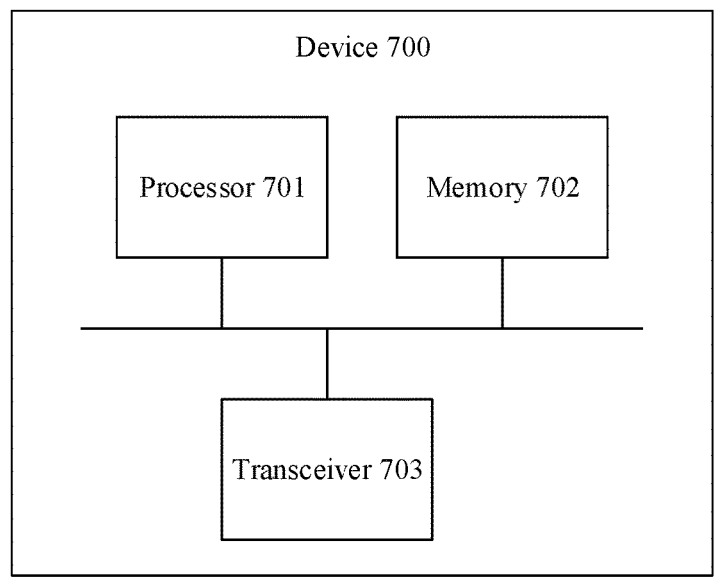
FIG. 20 is a schematic structural diagram of an interleaving device 700 according to this application.

FIG. 20 is a schematic structural diagram of an interleaving device 700 according to this application. As shown in FIG. 20, the device 700 includes: one or more processors 701, one or more memories 702, and one or more transceivers 703. The processor 701 is configured to control the transceiver 703 to send or receive a signal. The memory 702 is configured to store a computer program. The processor 701 is configured to invoke the computer program from the memory 702 and run the computer program, so that the device 700 performs corresponding procedures and/or operations in various embodiments of the interleaving method. For brevity, details are not described herein again.

It should be noted that the apparatus 500 shown in FIG. 19 may be implemented by the device 700 shown in FIG. 20. For example, the receiving unit 510 may be implemented by the transceiver 703 in FIG. 20. The processing unit 520 may be implemented by the processor 701, and so on.

The interleaving device herein may be the network device or the terminal device (for example, the terminal device #1 or the terminal device #2) shown in FIG. 1. Specifically, during uplink transmission, the interleaving device is specifically a terminal device, and the terminal device has functions of implementing the interleaving method described in the foregoing embodiments. These functions may be implemented by hardware, or may be implemented by hardware executing corresponding software. The hardware or the software includes one or more units corresponding to the foregoing functions. During downlink transmission, the interleaving device is specifically a network device (for example, a base station), and the network device has functions of implementing the interleaving method described in the foregoing embodiments. Similarly, these functions may be implemented by hardware, or may be implemented by hardware executing corresponding software. The hardware or the software includes one or more units corresponding to the functions.

Figure 21:
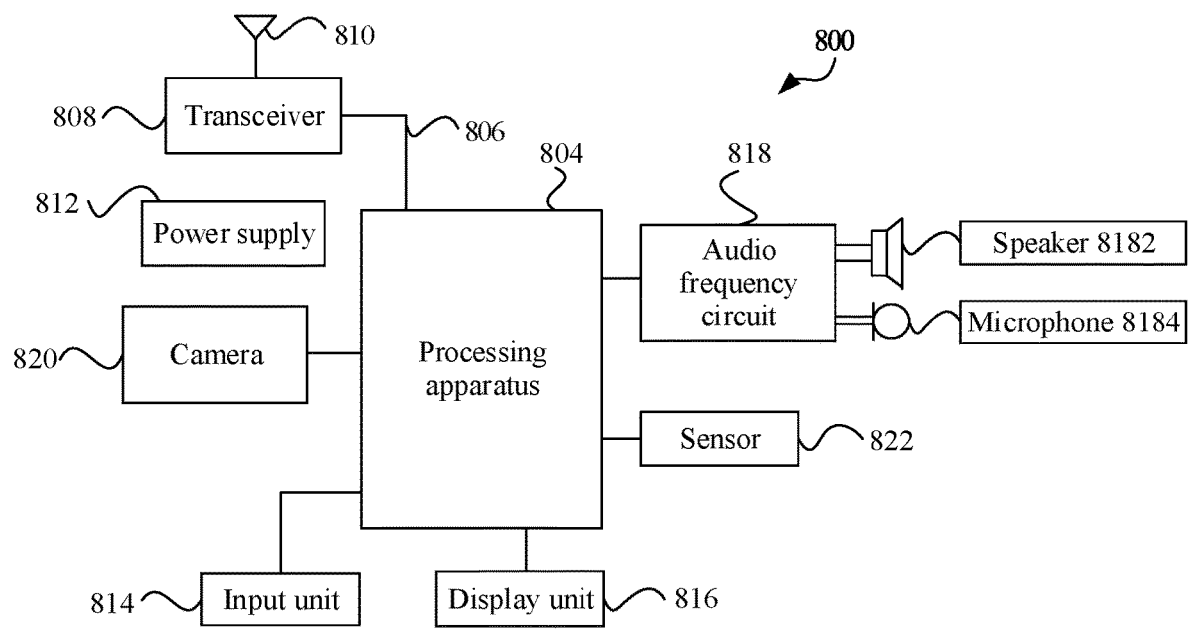
FIG. 21 is a structural diagram of a terminal device 800 according to this application.

When the interleaving device 700 is specifically a terminal device, a structure of the terminal device may be shown in FIG. 21. FIG. 21 is a schematic structural diagram of a terminal device 800 according to this application.

As shown in FIG. 21, terminal device 800 includes a transceiver 808 and a processor 804. The terminal device 800 may further include a memory 819, and the memory 819 stores a computer-executable instruction.

The transceiver 808 is configured to obtain a first bit sequence, where the first bit sequence includes L number of bits, and L is a positive integer.

The processor 804 is configured to: write the first bit sequence into an interleaving matrix according to a preset write rule, and read the L number of bits according to a preset read rule, to obtain a second bit sequence, where the second bit sequence includes L number of bits, the interleaving matrix includes C rows and R number of columns, and C and R are positive integers.

The transceiver 808 is configured to output the second bit sequence based on an instruction of the processor 804.

Further, the processor 804 may be configured to perform an action that is implemented inside the interleaving device and that is described in the foregoing method embodiments, and the transceiver 808 may be configured to perform a sending or receiving action that is performed by the interleaving device and that is described in the foregoing method embodiments. For details, refer to the descriptions in the foregoing method embodiments. Details are not described herein again.

The processor 804 and the memory 819 may be integrated into one processing apparatus. The processor 804 is configured to execute program code stored in the memory 819 to implement the foregoing functions. During specific implementation, the memory 819 may be alternatively integrated into the processor 804.

The terminal device 800 may further include a power supply 812, configured to supply power to various components or circuits in the terminal device 800. The terminal device 800 may include an antenna 810, configured to send, by using a radio signal, data or information output by the transceiver 808.

In addition, to improve functions of the terminal device 800, the terminal device 800 may further include one or more of an input unit 814, a display unit 816, an audio frequency circuit 818, a camera 820, a sensor 822, and the like. The audio frequency circuit may further include a speaker 8182, a microphone 8184, and the like.

In addition, this application provides a computer-readable storage medium. The computer-readable storage medium stores an instruction. When the instruction is run on a computer, the computer is enabled to perform the interleaving method in the foregoing embodiments.

This present disclosure further provides a computer program product. The computer program product includes computer program code. When the computer program code is run on a computer, the computer is enabled to perform the interleaving method described in any one of the foregoing embodiments.

This application further provides a chip (or a chip system). The chip includes a memory and a processor. The memory is configured to store a computer program, and the processor is configured to invoke the computer program from the memory and run the computer program, so that a communications device on which the chip is installed performs the interleaving method in the foregoing method embodiments of this application.

The communications device herein may be a network device or a terminal device.

This application further provides a coding apparatus. The coding apparatus has functions of implementing the interleaving method in any one of the foregoing method embodiments. The functions may be implemented by hardware, or may be implemented by hardware executing corresponding software. The hardware or the software includes one or more modules corresponding to the foregoing functions. In addition, the coding apparatus further has a related function for implementing polar coding. After performing polar coding on a to-be-coded sequence, the coding apparatus interleaves a coded sequence by using the interleaving method provided in this application, and then performs subsequent modulation, mapping, sending, and the like.

In an example design, when some or all of the functions are implemented by hardware, the coding apparatus includes:

an input interface circuit, configured to obtain a first bit sequence;

a logic circuit, configured to perform the interleaving method in any possible design in the foregoing embodiments, to interleave the first bit sequence, so as to obtain a second bit sequence; and an output interface circuit, configured to output the second bit sequence.

In some embodiments, the coding apparatus may be a chip or an integrated circuit.

In another example design, when some or all of the functions are implemented by software, the coding apparatus includes: a memory, configured to store a program; and a processor, configured to execute the program stored in the memory. When the program is executed, the coding apparatus may implement the interleaving method in any possible design in the foregoing embodiments.

In still another example design, when some or all of the functions are implemented by software, the coding apparatus includes a processor. A memory configured to store a program is located outside the coding apparatus. The processor is connected to the memory through a circuit/an electric wire, and is configured to read and execute the program stored in the memory.

In some embodiments, the memory and the memory may be physically independent units, or the memory may be integrated into the processor.

Figure 22:
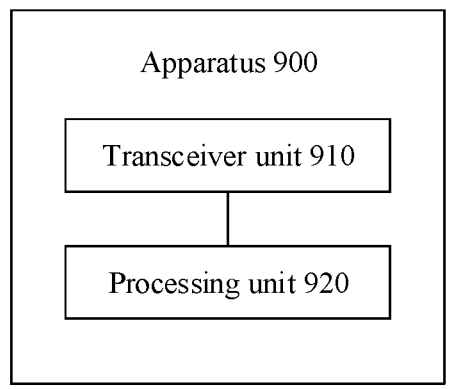
FIG. 22 is a schematic diagram of a deinterleaving apparatus 900 according to this application.

In addition, this application further provides a deinterleaving apparatus 900. FIG. 22 is a schematic diagram of the deinterleaving apparatus 900 according to this application. As shown in FIG. 22, the apparatus 900 includes a transceiver unit 910 and a processing unit 920.

The transceiver unit 910 is configured to obtain a to-be-deinterleaved bit sequence.

The processing unit 920 is configured to deinterleave the to-be-deinterleaved bit sequence based on a preset write rule and read rule, to obtain a deinterleaved bit sequence.

In some embodiments, the units of the deinterleaving apparatus 900 are respectively configured to implement corresponding functions in the deinterleaving method. These functions may be implemented by hardware, or may be implemented by hardware executing corresponding software.

When the deinterleaving method is implemented by hardware, the deinterleaving apparatus 900 includes:

an input interface circuit, configured to obtain a to-be-deinterleaved bit sequence;

a logic circuit, configured to deinterleave the to-be-deinterleaved bit sequence according to a preset write rule and read rule described in the embodiments of this application, to obtain a deinterleaved bit sequence; and an output interface circuit, configured to output the deinterleaved bit sequence.

In an ideal noiseless case, the deinterleaved bit sequence is the same as the first bit sequence described above.

Figure 23:
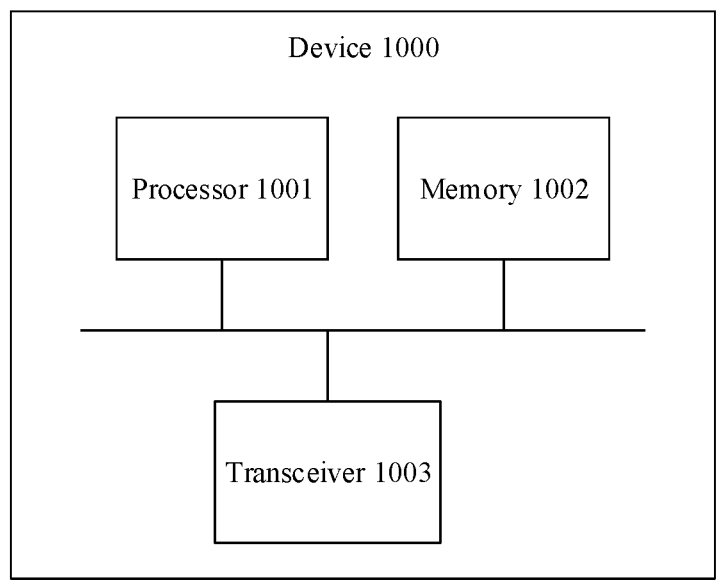
FIG. 23 is a schematic structural diagram of a deinterleaving device 1000 according to this application.

FIG. 23 is a schematic structural diagram of a deinterleaving device 1000 according to this application. As shown in FIG. 23, the device 1000 includes: one or more processors 1001, one or more memories 1002, and one or more transceivers 1003. The processor 1001 is configured to control the transceiver 1003 to send or receive a signal. The memory 1002 is configured to store a computer program. The processor 1001 is configured to invoke the computer program from the memory 1002 and run the computer program, so that the device 1000 performs corresponding procedures and/or operations in various embodiments of the deinterleaving method. For brevity, details are not described herein again.

It should be noted that the apparatus 900 shown in FIG. 22 may be implemented by the device 1000 shown in FIG. 23. For example, the transceiver unit 910 may be implemented by the transceiver 1003 in FIG. 23. The processing unit 920 may be implemented by the processor 1001, and so on.

During uplink transmission, the deinterleaving apparatus 900 is specifically the network device shown in FIG. 1. During downlink transmission, the deinterleaving apparatus is specifically the terminal device (for example, the terminal device #1 or the terminal device #2) shown in FIG. 1.

In addition, the deinterleaving apparatus 900 may alternatively be a chip, so that a communications device on which the chip is installed may perform the deinterleaving method in the embodiments of this application. The chip may be installed on a network device, so that the network device has functions of implementing the deinterleaving method. Alternatively, the chip may be installed on a terminal device, so that the terminal device has functions of implementing the deinterleaving method.

In addition, this application provides a computer-readable storage medium. The computer-readable storage medium stores an instruction. When the instruction is run on a computer, the computer is enabled to perform the deinterleaving method in the foregoing embodiments.

The present disclosure further provides a computer program product. The computer program product includes computer program code. When the computer program code is run on a computer, the computer is enabled to perform the deinterleaving method described in any one of the foregoing embodiments.

The present disclosure further provides a decoding apparatus. The decoding apparatus has functions of implementing the deinterleaving method in the foregoing embodiments of this application. The functions may be implemented by hardware, or may be implemented by hardware executing corresponding software. In addition, the coding apparatus further has a related function for implementing polar code decoding, for example, rate dematching or decoding.

In the foregoing embodiments, the processor may be a central processing unit (central processing unit, CPU), a microprocessor, an application-specific integrated circuit (application-specific integrated circuit, ASIC), one or more integrated circuits for controlling program execution of various embodiments described herein, or the like. For example, the processor may include a digital signal processor device, a microprocessor device, an analog-to-digital converter, and a digital-to-analog converter. The processor may allocate mobile device control and signal processing functions between these devices based on respective functions of the devices. In addition, the processor may include functions for operating one or more software programs, and the software programs may be stored in the memory.

The functions of the processor may be implemented by hardware or may be implemented by hardware executing corresponding software. The hardware or the software includes one or more modules corresponding to the foregoing functions.

The memory may be a read-only memory (read-only memory, ROM), another type of static storage device capable of storing static information and instructions, a random access memory (random access memory, RAM), or another type of dynamic storage device capable of storing information and instructions, or may be an electrically erasable programmable read-only memory (electrically erasable programmable read-only memory, EEPROM), a compact disc read-only memory (compact disc read-only memory, CD-ROM) or another compact disc storage, an optical disc storage (which includes a compact disc, a laser disc, an optical disc, a digital versatile disc, a Blu-ray disc, and the like), a disk storage medium or another magnetic storage device, or any other medium that can be used to carry or store expected program code having an instruction or a data structure form and that can be accessed by a computer. However, this is not limited herein.

With reference to the foregoing descriptions, a person skilled in the art may be aware that the methods of the embodiments in this specification may be implemented by hardware (for example, a logic circuit) or software, or a combination of hardware and software. Whether the methods are performed by hardware or software depends on particular applications and design constraints of the technical solutions. A person skilled in the art may use different methods to implement the described functions for each particular application, but it should not be considered that the implementation goes beyond the scope of this application.

When the functions are implemented in a form of software and sold or used as an independent product, the functions may be stored in a computer-readable storage medium. In this case, the technical solutions of this application essentially, or the part contributing to the prior art, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An interleaving method, comprising:
   obtaining a first bit sequence, wherein the first bit sequence comprises L number of bits, and L is a positive integer;
   writing the L number bits into an interleaving matrix according to a preset write rule, wherein the interleaving matrix comprises C number of rows and R number of columns, C and R are positive integers, and the write rule indicates the interleaving matrix comprises at least two columns having different quantities of bits;
   reading the L number of bits from the interleaving matrix according to a preset read rule, to obtain a second bit sequence, wherein a bit quantity of the second bit sequence is also L; and
   sending the second bit sequence.

2. The method according to claim 1, wherein the writing the L number of bits into an interleaving matrix according to the write rule comprises:
   writing the L number of bits into at least one interleaving unit of the interleaving matrix column by column.

3. The method according to claim 1, wherein writing the L number of bits into an interleaving matrix according to the write rule comprises:
   writing the L number of bits into an $i^{th}$ interleaving unit of the interleaving matrix column by column, wherein each column comprises $B_i$ number of bits, the $i^{th}$ interleaving unit comprises $B_i$ number of rows and R number of columns, $i \geq 2$ and is an integer, $B_i$ is a positive integer, the interleaving matrix comprises at least two interleaving units, each interleaving unit comprises R number of columns, and any two of the at least two interleaving units comprise different quantities of rows.

4. The method according to claim 1, wherein writing the L number of bits into an interleaving matrix according to the write rule comprises:
   writing the L number of bits into the R number of columns of the interleaving matrix column by column, wherein a quantity $B_j$ number of bits written into each of the R number of columns is different, quantities of bits written into the first column to an $R^{th}$ column in the R number of columns progressively increase or decrease as the column index j increases, j traverses values in {1, 2, ..., R}, and $B_j$ is a positive integer.

5. The method according to claim 4, wherein $B_j$ is an exponential power of 2, or $B_j$ is an odd number or a prime number.

6. The method according to claim 1, wherein writing the L number of bits into the interleaving matrix according to the write rule comprises:
   writing the L number of bits into the R number of columns of the interleaving matrix column by column in n rounds, wherein writing is performed into at least one of the R number of columns in each round, a quantity $B_k$ of bits written into the at least one column in each round progressively increases as the column index k increases, $n \geq 2$ and is an integer, $1 \leq k \leq R$, and k and $B_k$ are positive integers.

7. The method according to claim 1, wherein when the L number of bits are written into the interleaving matrix according to the write rule, and write directions in any two rounds of writing are the same or different.

8. A non-transitory computer readable storage medium, wherein the computer-readable storage medium stores a computer program, and when the computer program is executed on a computer, the computer is enabled to:

obtain a first bit sequence, wherein the first bit sequence comprises L number of bits, and L is a positive integer;

write the L number of bits into an interleaving matrix according to a preset write rule, wherein the interleaving matrix comprises C number of rows and R number of columns, C and R are positive integers, and the write rule indicates the interleaving matrix comprises at least two columns having different quantities of bits;

read the L number of bits from the interleaving matrix according to a preset read rule, to obtain a second bit sequence; and send the second bit sequence.

9. The non-transitory computer readable storage medium according to claim 8, wherein the computer is further enabled to:

write the L number of bits into at least one interleaving unit of the interleaving matrix column by column.

10. The non-transitory computer readable storage medium according to claim 8, wherein computer is further enabled to:

write the L number of bits into an $i^{th}$ interleaving unit of the interleaving matrix column by column, wherein each column comprises $B_i$ number of bits, the $i^{th}$ interleaving unit comprises $B_i$ rows and R number of columns, i≥2, $B_i$ and i are positive integers, the interleaving matrix comprises at least two interleaving units, each interleaving unit comprises R number of columns, and any two of the at least two interleaving units comprise different quantities of rows.

11. The non-transitory computer readable storage medium according to claim 8, wherein computer is further enabled to:

write the L number of bits into the R number of columns of the interleaving matrix column by column, wherein a quantity $B_j$ of bits written into each of the R number of columns is different, quantities of bits written into the first column to an $R^{th}$ column in the R number of columns progressively increase or decrease as the column index j increases, j traverses values in {1, 2, . . . , R}, and $B_j$ is a positive integer.

12. The non-transitory computer readable storage medium according to claim 11, wherein $B_j$ is an exponential power of 2, or $B_j$ is an odd number or a prime number.

13. The non-transitory computer readable storage medium according to claim 8, wherein computer is further enabled to:

write the L number of bits into the R number of columns of the interleaving matrix column by column inn rounds, wherein writing is performed into at least one of the R number of columns in each round, a quantity $B_k$ number of bits written into the at least one column in each round progressively increases as the column index k increases, n≥2 and is an integer, 1≤k≤R, and k and $B_k$ are positive integers.

14. The non-transitory computer readable storage medium according to claim 8, wherein when writing the L number of bits into the interleaving matrix, write directions in any two rounds of writing are the same or different.

15. An interleaving device, comprising:

a transceiver, configured to obtain a first bit sequence, wherein the first bit sequence comprises L number of bits, and L is a positive integer; and a processor, configured to invoke computer programs stored in a memory of the interleaving device such that when the computer programs are invoked the processor is caused to:

write the L number of bits into an interleaving matrix according to a preset write rule, wherein the interleaving matrix comprises C number of rows and R number of columns, C and R are positive integers, and the write rule indicates the interleaving matrix comprises at least two columns having different quantities of bits;

read the L number of bits from the interleaving matrix according to a preset read rule, to obtain a second bit sequence; and cause the transceiver to send, based on an instruction of the processor, the second bit sequence generated by the processor.

16. The interleaving device according to claim 15, wherein the processor is configured to:

write the L number of bits into at least one interleaving unit of the interleaving matrix column by column.

17. The interleaving device according to claim 15, wherein the processor is configured to:

write the L number of bits into an $i^{th}$ interleaving unit of the interleaving matrix column by column, wherein each column comprises Bi number of bits, the $i^{th}$ interleaving unit comprises $B_i$ rows and R number of columns, i≥2, $B_i$ and i are positive integers, the interleaving matrix comprises at least two interleaving units, each interleaving unit comprises R number of columns, and any two of the at least two interleaving units comprise different quantities of rows.

18. The interleaving device according to claim 15, wherein the processor is configured to:

write the L number of bits into the R number of columns of the interleaving matrix column by column, wherein a quantity $B_j$ number of bits written into each of the R number of columns is different, quantities of bits written into the first column to an $R^{th}$ column in the R number of columns progressively increase or decrease as the column index j increases, j traverses values in {1, 2, . . . , R}, and $B_j$ is a positive integer.

19. The interleaving device according to claim 15, wherein the processor is configured to:

write the L number of bits into the R number of columns of the interleaving matrix column by column inn rounds, wherein writing is performed into at least one of the R number of columns in each round, a quantity $B_k$ number of bits written into the at least one column in each round progressively increases as the column index k increases, n≥2 and is an integer, 1≤k≤R, and k and $B_k$ are integers.

20. The interleaving device according to claim 15, wherein when writing the L number of bits into the interleaving matrix, write directions in any two rounds of writing are the same or different.

* * * * *